(12) United States Patent
Mestres et al.

(10) Patent No.: US 11,909,100 B2
(45) Date of Patent: Feb. 20, 2024

(54) SYSTEMS AND METHODS FOR THE ANALYSIS OF USER EXPERIENCE TESTING WITH AI ACCELERATION

(71) Applicant: Userzoom Technologies, Inc., Dover, DE (US)

(72) Inventors: Xavier Mestres, Barcelona (ES); David Sanchez, Barcelona (ES); Xavier Pujol, Barcelona (ES); Francesc del Castillo, Barcelona (ES); Robert Derward Rogers, Oakland, CA (US)

(73) Assignee: USERZOOM TECHNOLOGIES, INC., Los Gatos, CA (US)

( * ) Notice: Subject to any disclaimer, the term of this patent is extended or adjusted under 35 U.S.C. 154(b) by 0 days.

(21) Appl. No.: 18/063,225

(22) Filed: Dec. 8, 2022

(65) Prior Publication Data
US 2023/0187813 A1  Jun. 15, 2023

Related U.S. Application Data

(60) Division of application No. 16/991,958, filed on Aug. 12, 2020, now Pat. No. 11,544,135, which is a
(Continued)

(51) Int. Cl.
*H01Q 1/22* (2006.01)
*H01Q 9/04* (2006.01)
(Continued)

(52) U.S. Cl.
CPC .......... *H01Q 1/2283* (2013.01); *H01L 23/31* (2013.01); *H01L 23/66* (2013.01); *H01Q 9/0407* (2013.01)

(58) Field of Classification Search
CPC ............... G06F 11/079; G06F 11/0736; G06F 11/0751; G06F 16/2458; G06F 8/20;
(Continued)

(56) References Cited

U.S. PATENT DOCUMENTS 4,845,665 A   7/1989  Heath et al.
5,086,393 A   2/1992  Kerr
(Continued)

FOREIGN PATENT DOCUMENTS

AU      2015101408      11/2015
WO   WO 2001024057      4/2001
(Continued)

OTHER PUBLICATIONS

European Patent Office, "Communication pursuant to Art. 153(7) EPC", in European Application No. 20747572.4, dated Sep. 20, 2022, 9 pages.
(Continued)

*Primary Examiner* — Michael A Keller
(74) *Attorney, Agent, or Firm* — Kang S. Lim

(57) ABSTRACT

Systems and methods for AI assisted analysis of a user experience study are provided. A study objective (a goal of the study) and data relating to all possible navigation routes within a digital interface are received. Simulated clickstreams for navigating from any state of the digital interface to the study objective are generated. This simulated clickstream data is then used to train one or more machine learning models to determine a most efficient path to achieve the study objective from any state of the digital interface. Subsequently, study results from many different participants is received. Key events are then identified within the study results. Additionally, the likelihood of failure for each of the plurality of study results is predicted using the machine learning model, and information density of the plurality of study results is determined.

7 Claims, 23 Drawing Sheets

Related U.S. Application Data continuation-in-part of application No. 16/730,957, filed on Dec. 30, 2019, and a continuation-in-part of application No. 16/730,954, filed on Dec. 30, 2019, now Pat. No. 11,068,374.

(60) Provisional application No. 62/887,031, filed on Aug. 15, 2019, provisional application No. 62/799,646, filed on Jan. 31, 2019.

(51) Int. Cl.
*H01L 23/31* (2006.01)
*H01L 23/66* (2006.01)

(58) Field of Classification Search
CPC .... G06F 9/451; G06F 11/008; G06F 11/3438; G06N 20/00; G06N 3/006
See application file for complete search history.

(56) References Cited

U.S. PATENT DOCUMENTS

| | | | |
|---|---|---|---|
| 5,220,658 A | 6/1993 | Kerr | |
| 5,724,262 A | 3/1998 | Ghahramani | |
| 5,808,908 A | 9/1998 | Ghahramani | |
| 6,237,138 B1 | 5/2001 | Hameluck | |
| 6,526,526 B1 | 2/2003 | Dong | |
| 6,738,082 B1 | 5/2004 | Dong et al. | |
| 6,859,784 B1 | 2/2005 | Van Duyne et al. | |
| 6,895,437 B1 | 5/2005 | Cowdrey | |
| 7,222,078 B2 | 5/2007 | Abelow | |
| 7,433,874 B1 | 10/2008 | Wolfe | |
| 7,587,484 B1 | 9/2009 | Smith | |
| 7,941,525 B1 | 5/2011 | Yavilevich | |
| 8,892,543 B1 | 11/2014 | Kapoor | |
| 10,178,190 B2 | 1/2019 | Qiao | |
| 10,789,643 B1 | 9/2020 | Chang | |
| 11,068,374 B2 | 7/2021 | Mestres et al. | |
| 11,544,135 B2 | 1/2023 | Mestres et al. | |
| 2001/0049084 A1 | 12/2001 | Mitry | |
| 2002/0143931 A1 | 10/2002 | Smith | |
| 2002/0178163 A1 | 11/2002 | Mayer | |
| 2002/0194053 A1 | 12/2002 | Barrett | |
| 2002/0196277 A1 | 12/2002 | Bushey | |
| 2003/0046057 A1 | 3/2003 | Okunishi | |
| 2004/0015867 A1 | 1/2004 | Macko | |
| 2004/0177002 A1 | 9/2004 | Abelow | |
| 2005/0254775 A1 | 11/2005 | Hamilton | |
| 2006/0184917 A1 | 8/2006 | Troan | |
| 2007/0106641 A1 | 5/2007 | Chi | |
| 2007/0209010 A1 | 9/2007 | West | |
| 2007/0233622 A1 | 10/2007 | Willcock | |
| 2008/0313149 A1 | 12/2008 | Li | |
| 2008/0313617 A1 | 12/2008 | Zhu | |
| 2008/0313633 A1 | 12/2008 | Zhu | |
| 2009/0138292 A1 | 5/2009 | Dusi | |
| 2009/0150724 A1 | 6/2009 | Pramidi | |
| 2009/0204573 A1 | 8/2009 | Neuneier | |
| 2009/0271788 A1 | 10/2009 | Holt | |
| 2009/0281819 A1 | 11/2009 | Garg | |
| 2009/0281852 A1 | 11/2009 | Abhari et al. | |
| 2010/0030792 A1 | 2/2010 | Swinton et al. | |
| 2010/0095208 A1 | 4/2010 | White et al. | |
| 2010/0251291 A1 | 9/2010 | Pino, Jr. et al. | |
| 2011/0166884 A1 | 7/2011 | Lesselroth | |
| 2011/0314092 A1 | 12/2011 | Lunt et al. | |
| 2012/0078660 A1 | 3/2012 | Mangicaro | |
| 2012/0131476 A1 | 5/2012 | Mestres | |
| 2012/0210209 A1 | 8/2012 | Biddle | |
| 2012/0278388 A1 | 11/2012 | Kleinbart | |
| 2013/0132833 A1 | 5/2013 | White | |
| 2013/0254735 A1 | 9/2013 | Sakhardande | |
| 2014/0052853 A1 | 2/2014 | Mestres | |
| 2014/0189054 A1 | 7/2014 | Snider et al. | |
| 2014/0214483 A1 | 7/2014 | Minnis et al. | |
| 2016/0217481 A1 | 7/2016 | Pastore | |
| 2017/0078419 A1 | 3/2017 | Yavilevich | |
| 2017/0160918 A1 | 6/2017 | Torbey et al. | |
| 2017/0228745 A1 | 8/2017 | Garcia et al. | |
| 2019/0130327 A1 | 5/2019 | Carpenter et al. | |
| 2019/0188326 A1* | 6/2019 | Daianu | G06F 16/90332 |
| 2019/0317739 A1 | 10/2019 | Turek | |
| 2020/0074006 A1* | 3/2020 | Ram | G06F 16/9577 |
| 2021/0034707 A1* | 2/2021 | Podgorny | G06F 16/3349 |

FOREIGN PATENT DOCUMENTS

| | | |
|---|---|---|
| WO | W/O 2020/072701 | 4/2020 |
| WO | W/O 2020/159665 | 8/2020 |
| WO | W/O 2020/223409 | 11/2020 |

OTHER PUBLICATIONS

Desolda Guiseppe: "UTAssistant: a Web Platform Supporting Usability Testing in Italian Public Administrations", in DCPD@ CHItaly, Sep. 1, 2017 (Sep. 1, 2017), XP055959540, Retrieved from the Internet: URL:http://ceur-ws.org/Vol-1910/paper0209.pdf [retrieved on Sep. 9, 2022] abstract p. 1-p. 4.

Saqer Haneen et al: "Expanding the Usability Toolkit: Using PowerPoint(TM) to Perform Website Analysis and Testing", Proceedings of the Human Factors and Ergonomics Society Annual Meeting, val. 56, No. 1, Sep. 1, 2012 (Sep. 1, 2012), pp. 600-604, XP055959769, ISSN: 2169-5067, DOI: 10.1177/1071181312561125, Retrieved from the Internet: URL:http://:journals.sagepub.com/doi/pdf/10.1177/1071181312561125> p. 1 p. 4-p. 5.

Lenin Nair: "How to Record Your Website Visitors & Their Actions With a Session Replay Tool", Aug. 16, 2018 (Aug. 16, 2018), XP055960089, Retrieved from the Internet: URL: https://web.archive.org/web/20180816194508/https://www.zoomowl.com/record-web-visitors-session-replay/ [retrieved on Sep. 12, 2022]p. 1-p. 6.

European Patent Office, "Communication pursuant to Rule 164(1) EPC", in European Application No. 208524652, dated Jul. 31, 2023, 18 pages.

CJ Haughey: "How to Improve UX With AI and Machine Learning", Jul. 30, 2019 (Jul. 30, 2019), pp. 1-17, XP093063938, Retrieved from the Internet: URL:https%3A%2Fwww.springboard.com%2Fblog%2Fdesign%2Fimprove-ux-with-ai-machine-learning%2F [retrieved on Jul. 13, 2023]* p. 1-p. 6 *.

Robert Gove et al: "Identifying Infeasible GUI Test Cases Using Support Vector Machines and Induced Grammars", Software Testing, Verification and Validation Workshops (ICSTW), 2011 IEEE Fourth International Conference on, IEEE, Mar. 21, 2011 (Mar. 21, 2011), pp. 202-211, XP031895110, DOI: 10.1109/ICSTW.2011.73 ISBN: 978-1-4577-0019-4 * p. 202-p. 204 *.

Gardey Juan Cruz jcgardey@lifia info unlp edu ar et al: "User Experience Evaluation through Automatic A/B Testing", Proceedings of the 25th International Conference on Intelligent User Interfaces Companion, ACMPUB27, New York, NY, USA, Mar. 17, 2020 (Mar. 17, 2020), pp. 25-26, XP058474412, DOI: 10.1145/3379336.3381514 ISBN: 978-1-4503-7513-9 * p. 25-p. 26 *.

User-Centred Library Websites: Usability Evaluation Methods by Carole George, Edition:2008.

Richard Atterer, Monika Wnuk, and Albrecht Schmidt (Knowing the User's Every Move—User Activity Tracking for Website Usability Evaluation and Implicit Interaction, International World Wide Web Conference Committee, May 23-26, 2006, Edinburgh, Scotland). (Year:2006).

Jason I. Hong, Jeffrey Heer, Sarah Waterson, and James A. Landay (WebQuilt: a Proxy-based Approach to Remote Web Usability Testing, ACM Transactions on Information Systems, vol. 19, No. 3, Jul. 2001, pp. 263-285). (Year: 2001).

Non-Final Office Action for U.S. Appl. No. 13/112,792 dated August 1, 2014, 41 pages.

ISA/US, "Notification of Transmittal of the ISR and the Written Opinion of the International Searching Authority, or the Declaration," in PCT Application No. PCT/US2020/012218, dated May 28, 2020, 9 pages

(56) References Cited

OTHER PUBLICATIONS

ISA/US, "Notification of Transmittal of the ISR and the Written Opinion of the International Searching Authority, or the Declaration," in PCT Application No. PCT/US2020/046247, dated Jan. 19, 2021, 10 pages.

Agichtein et al. "Learning user interaction models for predicting web search result preferences." In: Proceedings of the $29^{th}$ annual international ACM SIGIR conference on Research and development in information retrieval. Aug. 11, 2006 (Aug. 11, 2006) Retrieved on Dec. 15, 2020 (Dec. 15, 2020) from <URL: https://dl.acm.org/doi/10.1145/1148170.1148175> entire document.

Li. "Using Deep Learning to Improve Usability on Mobile Devices." Apr. 2, 2019 (Apr. 2, 2019) In: Google AI Blog. Retrieved on Dec. 15, 2020 (Dec. 15, 2020) from <https://ai.googleblog.com/2019/04/using-deep-learning-to-improve.html> entire document.

* cited by examiner

SYSTEMS AND METHODS FOR THE ANALYSIS OF USER EXPERIENCE TESTING WITH AI ACCELERATION

CROSS REFERENCE TO RELATED APPLICATIONS

This non-provisional application is a Divisional and claims priority to U.S. application Ser. No. 16/991,958, filed on Aug. 12, 2020, entitled "SYSTEMS AND METHODS FOR THE ANALYSIS OF USER EXPERIENCE TESTING WITH AI ACCELERATION", which claims priority to U.S. Provisional Application No. 62/887,031, filed on Aug. 15, 2019, of the same title, by inventor Mestres et al.

This application is additionally a continuation-in-part application and claims priority to U.S. application Ser. No. 16/730,954, entitled "Generation, Administration and Analysis of User Experience Testing", now Issued U.S. Pat. No. 11,068,374 and U.S. application Ser. No. 16/730,957, entitled "Advanced Analysis of Online User Experience Studies", filed on Dec. 30, 2019 and pending, which applications claim priority to U.S. Provisional Application No. 62/799,646, entitled "Systems and Methods for the Generation, Administration and Analysis of User Experience Testing", filed on Jan. 31, 2019, now expired.

All of the above-listed applications/patents are incorporated herein in their entirety by this reference.

BACKGROUND

The present invention relates to systems and methods for the AI assisted analysis of user experience studies that allow for insight generation for the usability of a digital interface. These digital interfaces may commonly be a website, but may include application interfaces and the like. Generally, this type of testing is referred to as "User Experience" or merely "UX" testing.

The Internet provides new opportunities for business entities to reach customers via web sites that promote and describe their products or services. Often, the appeal of a web site and its ease of use may affect a potential buyer's decision to purchase the product/service.

Especially as user experiences continue to improve and competition online becomes increasingly aggressive, the ease of use by a particular retailer's website, or other digital interface, may have a material impact upon sales performance. Unlike a physical shopping experience, there are minimal hurdles to a user going to a competitor for a similar service or good. Thus, in addition to traditional motivators (e.g., competitive pricing, return policies, brand reputation, etc.) the ease of a website to navigate is of paramount importance to a successful online presence.

As such, assessing the appeal, user friendliness, and effectiveness of a web site is of substantial value to marketing managers, web site designers and user experience specialists; however, this information is typically difficult to obtain. Focus groups are sometimes used to achieve this goal but the process is long, expensive and not reliable, in part, due to the size and demographics of the focus group that may not be representative of the target customer base.

In more recent years advances have been made in the automation and implementation of mass online surveys for collecting user feedback information. Typically these systems include survey questions, or potentially a task on a website followed by feedback requests. While such systems are useful in collecting some information regarding user experiences, the studies often suffer from biases in responses, and limited types of feedback collected.

User experience testing however, is an extremely data intensive endeavor that is not well suited for analysis by simple rules or presently available automated methods. As such, analysis of user experience testing data is manually intensive, which injects a bottleneck into the process of generating insights from such testing.

Secondly, visualization generation that combines the clickstreams of multiple users into a single view are challenging, and to date are not effective. This is complicated by the fact that each web page can be labeled with many different URLs, and may contain many different graphical components as the result of online ads and other dynamic content. The inability to aggregate the different views of each web page into flow diagram visualizations causes the flow diagram analysis to be exceedingly difficult and tedious.

It is therefore apparent that an urgent need exists for advancements in the analysis of studies into user experiences that allows for AI assisted workflows. Such systems and methods allow for improvements in website design, marketing and brand management through the resulting insights that are generated from the analysis.

SUMMARY

To achieve the foregoing and in accordance with the present invention, systems and methods for AI assisted analysis of a user experience study. Such systems and methods allow for improvements in digital interface design, marketing and brand management through the resulting insights that are generated from the analysis.

In some embodiments, the systems and methods receiving a study objective (a goal of the study) and data relating to all possible navigation routes within a digital interface. This interface may include a website, a web application, a locally administered application, or any other digital experience. The system can generate simulated clickstreams for navigating from any state of the digital interface to the study objective. Generating the plurality of simulated clickstreams may include a series of search methods to explore state space within the digital interface. Generating the plurality of simulated clickstreams may be performed as an asynchronous batch dataset, or iteratively.

This simulated clickstream data is then used to train one or more machine learning models to determine a most efficient patch to achieve the study objective from any state of the digital interface. In some cases, the machine learning model is trained by reinforcement learning algorithms. In some particular instances, the machine learning model includes a distance model from each state of the web page to the study objective, wherein the distance model is a number of actions required to reach the study objective from a particular state. The distance model is a number of actions weighted by empirically measured time of each action, or frequency probability of each action, required to reach the study objective from a particular state Subsequently, study results from many different participants is received. The study results including clickstream data, video recording and audio recording. The clickstream data includes at least one of navigation actions, mouse movements, touch events, voice events, and motion events.

Key events are then identified within the study results. The key events are identified by video recognition of the video recording, audio analysis of the audio recording and clickstream data in combination with a known goal, to identify emotions of interest and keyword analysis. Additionally, the likelihood of failure for each of the plurality of study results is predicted using the machine learning model, and information density of the plurality of study results is determined.

Additionally, this failure prediction and information density info may be used to rank the plurality of studies by the information density, and cluster the plurality of studies by failure type and location. This may be finally rendered into a set of analysis results.

Note that the various features of the present invention described above may be practiced alone or in combination. These and other features of the present invention will be described in more detail below in the detailed description of the invention and in conjunction with the following figures.

BRIEF DESCRIPTION OF THE DRAWINGS

In order that the present invention may be more clearly ascertained, some embodiments will now be described, by way of example, with reference to the accompanying drawings, in which.

DETAILED DESCRIPTION

Figure 1A:
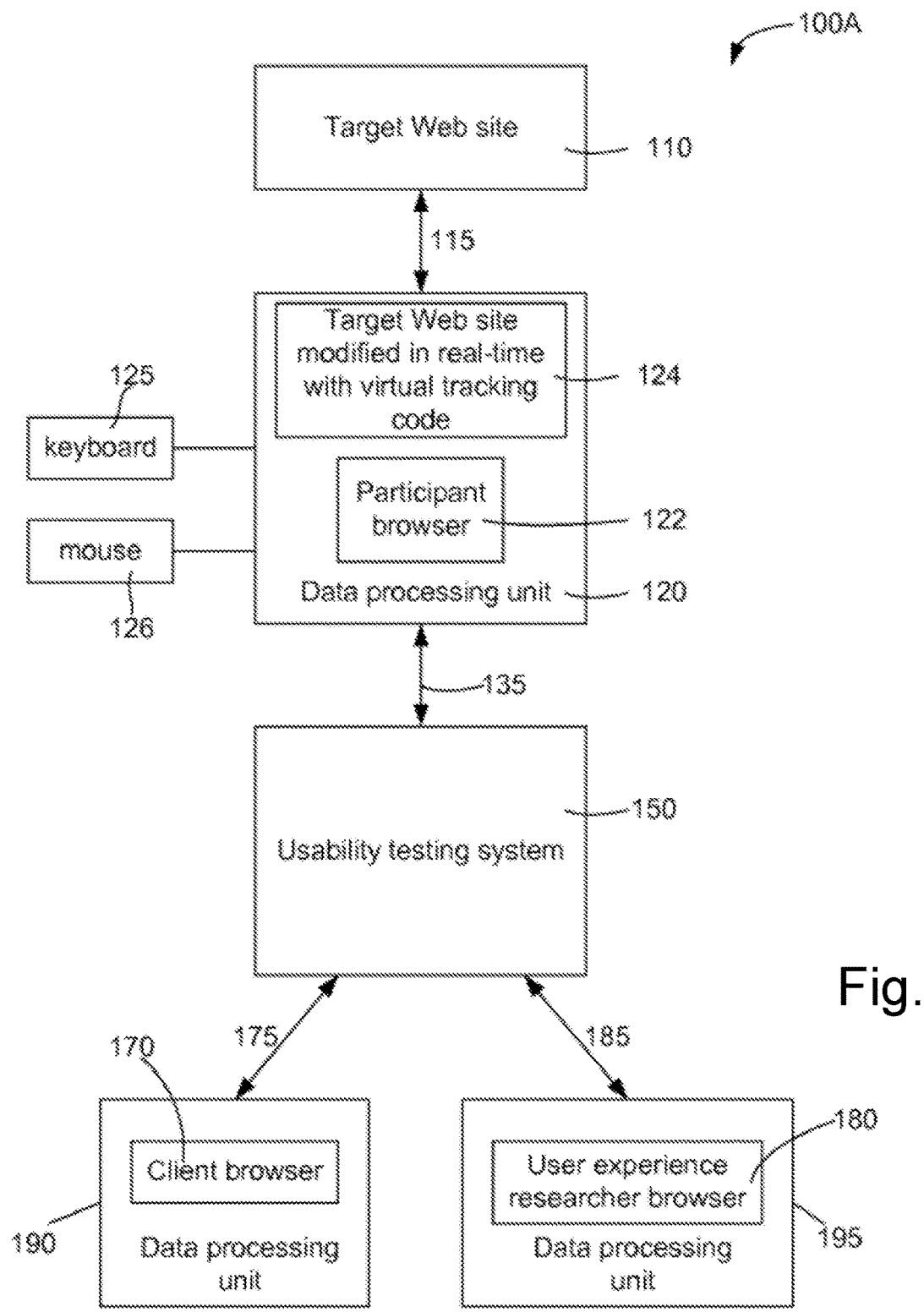
FIG. 1A is an example logical diagram of a system for user experience studies, in accordance with some embodiment.

The present invention will now be described in detail with reference to several embodiments thereof as illustrated in the accompanying drawings. In the following description, numerous specific details are set forth in order to provide a thorough understanding of embodiments of the present invention. It will be apparent, however, to one skilled in the art, that embodiments may be practiced without some or all of these specific details. In other instances, well known process steps and/or structures have not been described in detail in order to not unnecessarily obscure the present invention. The features and advantages of embodiments may be better understood with reference to the drawings and discussions that follow.

Aspects, features and advantages of exemplary embodiments of the present invention will become better understood with regard to the following description in connection with the accompanying drawing(s). It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute and/or sequential terms, such as, for example, "will," "will not," "shall," "shall not," "must," "must not," "first," "initially," "next," "subsequently," "before," "after," "lastly," and "finally," are not meant to limit the scope of the present invention as the embodiments disclosed herein are merely exemplary.

The present invention relates to enhancements to traditional user experience testing and subsequent insight generation. While such systems and methods may be utilized with any user experience environment, embodiments described in greater detail herein are directed to providing insights into user experiences in an online/webpage environment. Some descriptions of the present systems and methods will also focus nearly exclusively upon the user experience within a retailer's web site or other digital interface. This is intentional in order to provide a clear use case and brevity to the disclosure, however it should be noted that the present systems and methods apply equally well to any situation where a user experience in an online platform is being studied. As such, the focus herein on a retail setting is in no way intended to artificially limit the scope of this disclosure.

The following description of some embodiments will be provided in relation to numerous subsections. The use of subsections, with headings, is intended to provide greater clarity and structure to the present invention. In no way are the subsections intended to limit or constrain the disclosure contained therein. Thus, disclosures in any one section are intended to apply to all other sections, as is applicable.

The following systems and methods are for improvements in natural language processing and actions taken in response to such message exchanges, within conversation systems, and for employment of domain specific assistant systems that leverage these enhanced natural language processing techniques. The goal of the message conversations is to enable a logical dialog exchange with a recipient, where the recipient is not necessarily aware that they are communicating with an automated machine as opposed to a human user. This may be most efficiently performed via a written dialog, such as email, text messaging, chat, etc. However, given the advancement in audio and video processing, it may be entirely possible to have the dialog include audio or video components as well.

In the following it is understood that the term usability refers to a metric scoring value for judging the ease of use of a target web site. A client refers to a sponsor who initiates and/or finances the usability study. The client may be, for example, a marketing manager who seeks to test the usability of a commercial web site for marketing (selling or advertising) certain products or services. Participants may be a selected group of people who participate in the usability study and may be screened based on a predetermined set of questions. Remote usability testing or remote usability study refers to testing or study in accordance with which participants (referred to use their computers, mobile devices or otherwise) access a target web site in order to provide feedback about the web site's ease of use, connection speed, and the level of satisfaction the participant experiences in using the web site. Unmoderated usability testing refers to communication with test participants without a moderator, e.g., a software, hardware, or a combined software/hardware system can automatically gather the participants' feedback and records their responses. The system can test a target web site by asking participants to view the web site, perform test tasks, and answer questions associated with the tasks.

To facilitate the discussion, FIG. 1 is a simplified block diagram of a user testing platform 100A according to an embodiment. Platform 100A is adapted to test a target web site 110. Platform 100A is shown as including a usability testing system 150 that is in communications with data processing units 120, 190 and 195. Data processing units 120, 190 and 195 may be a personal computer equipped with a monitor, a handheld device such as a tablet PC, an electronic notebook, a wearable device such as a cell phone, or a smart phone.

Data processing unit 120 includes a browser 122 that enables a user (e.g., usability test participant) using the data processing unit 120 to access target web site 110. Data processing unit 120 includes, in part, an input device such as a keyboard 125 or a mouse 126, and a participant browser 122. In one embodiment, data processing unit 120 may insert a virtual tracking code to target web site 110 in real-time while the target web site is being downloaded to the data processing unit 120. The virtual tracking code may be a proprietary JavaScript code, whereby the run-time data processing unit interprets the code for execution. The tracking code collects participants' activities on the downloaded web page such as the number of clicks, key strokes, keywords, scrolls, time on tasks, and the like over a period of time. Data processing unit 120 simulates the operations performed by the tracking code and is in communication with usability testing system 150 via a communication link 135. Communication link 135 may include a local area network, a metropolitan area network, and a wide area network. Such a communication link may be established through a physical wire or wirelessly. For example, the communication link may be established using an Internet protocol such as the TCP/IP protocol.

Activities of the participants associated with target web site 110 are collected and sent to usability testing system 150 via communication link 135. In one embodiment, data processing unit 120 may instruct a participant to perform predefined tasks on the downloaded web site during a usability test session, in which the participant evaluates the web site based on a series of usability tests. The virtual tracking code (e.g., a proprietary JavaScript) may record the participant's responses (such as the number of mouse clicks) and the time spent in performing the predefined tasks. The usability testing may also include gathering performance data of the target web site such as the ease of use, the connection speed, the satisfaction of the user experience. Because the web page is not modified on the original web site, but on the downloaded version in the participant data processing unit, the usability can be tested on any web sites including competitions' web sites.

Data collected by data processing unit 120 may be sent to the usability testing system 150 via communication link 135. In an embodiment, usability testing system 150 is further accessible by a client via a client browser 170 running on data processing unit 190. Usability testing system 150 is further accessible by user experience researcher browser 180 running on data processing unit 195. Client browser 170 is shown as being in communications with usability testing system 150 via communication link 175. User experience research browser 180 is shown as being in communications with usability testing system 150 via communications link 185. A client and/or user experience researcher may design one or more sets of questionnaires for screening participants and for testing the usability of a web site. Usability testing system 150 is described in detail below.

Figure 1B:
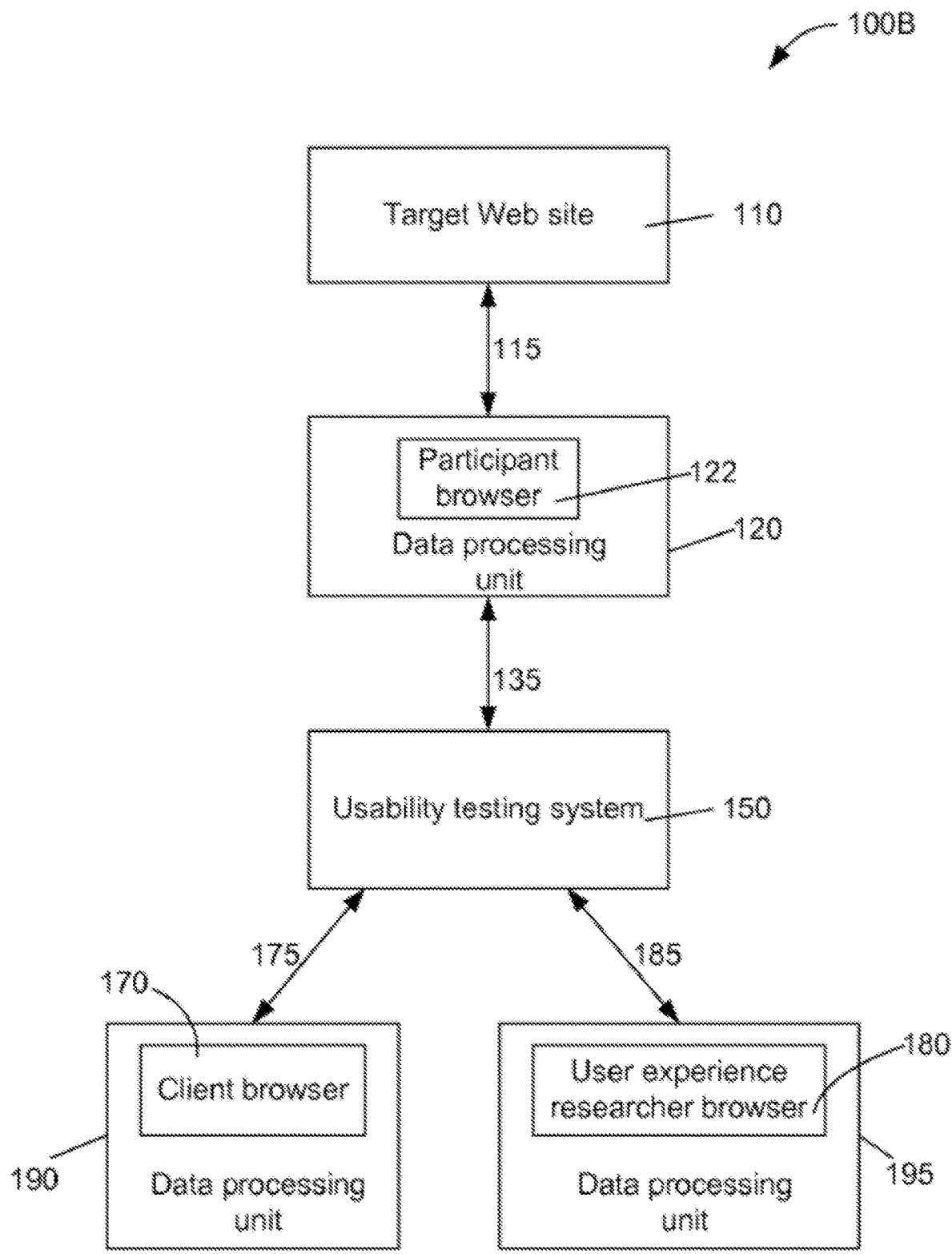
FIG. 1B is a second example logical diagram of a system for user experience studies, in accordance with some embodiment.

FIG. 1B is a simplified block diagram of a user testing platform 100B according to another embodiment of the present invention. Platform 100B is shown as including a target web site 110 being tested by one or more participants using a standard web browser 122 running on data processing unit 120 equipped with a display. Participants may communicate with a usability test system 150 via a communication link 135. Usability test system 150 may communicate with a client browser 170 running on a data processing unit 190. Likewise, usability test system 150 may communicate with user experience researcher browser running on data processing unit 195. Although a data processing unit is illustrated, one of skill in the art will appreciate that data processing unit 120 may include a configuration of multiple single-core or multi-core processors configured to process instructions, collect usability test data (e.g., number of clicks, mouse movements, time spent on each web page, connection speed, and the like), store and transmit the collected data to the usability testing system, and display graphical information to a participant via an input/output device (not shown).

Figure 1C:
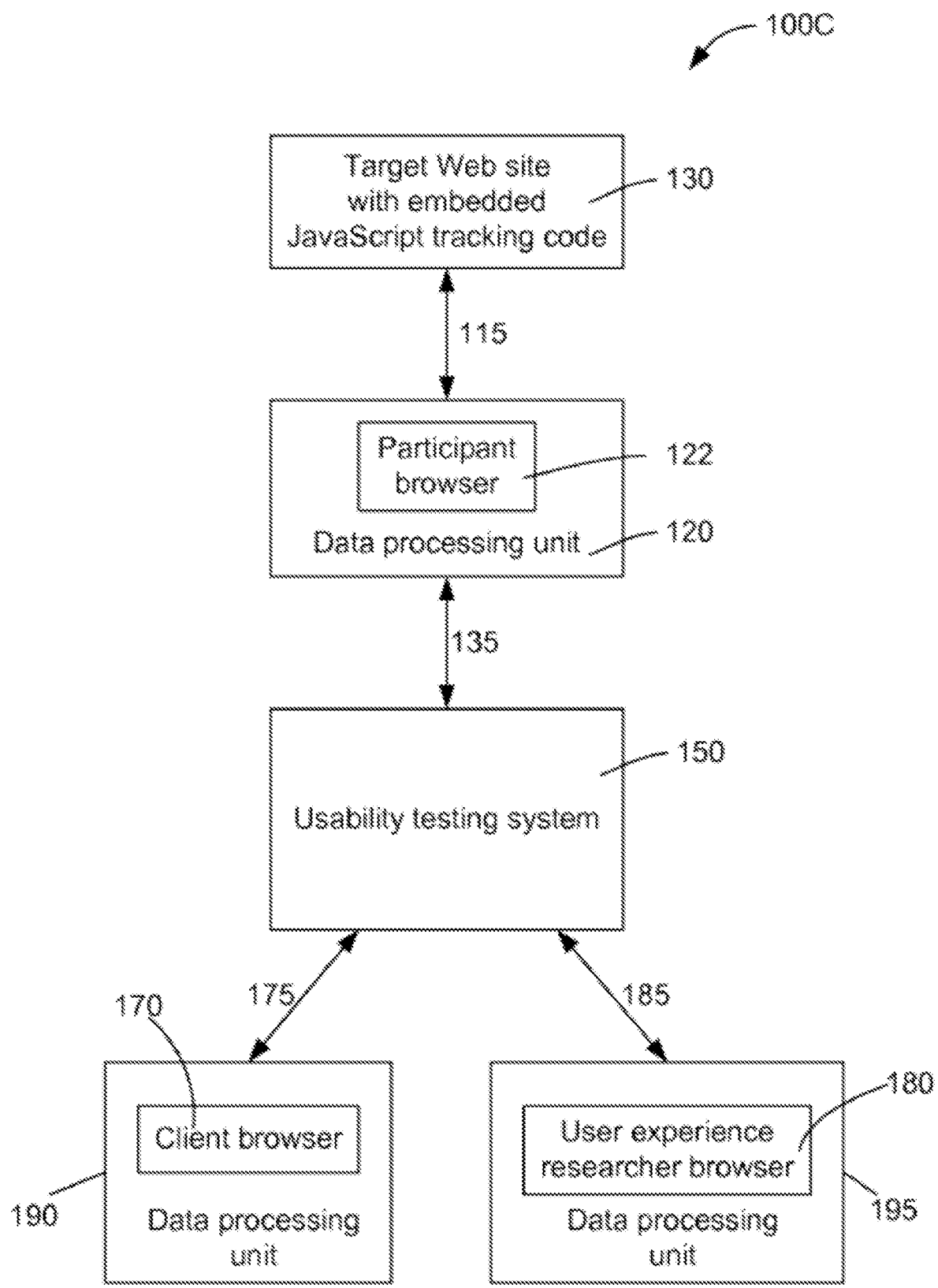
FIG. 1C is a third example logical diagram of a system for user experience studies, in accordance with some embodiment.

FIG. 1C is a simplified block diagram of a user testing platform 100C according to yet another embodiment of the present invention. Platform 100C is shown as including a target web site 130 being tested by one or more participants using a standard web browser 122 running on data processing unit 120 having a display. The target web site 130 is shown as including a tracking program code configured to track actions and responses of participants and send the tracked actions/responses back to the participant's data processing unit 120 through a communication link 115. Communication link 115 may be computer network, a virtual private network, a local area network, a metropolitan area network, a wide area network, and the like. In one embodiment, the tracking program is a JavaScript configured to run tasks related to usability testing and sending the test/study results back to participant's data processing unit for display. Such embodiments advantageously enable clients using client browser 170 as well as user experience researchers using user experience research browser 180 to design mockups or prototypes for usability testing of variety of web site layouts. Data processing unit 120 may collect data associated with the usability of the target web site and send the collected data to the usability testing system 150 via a communication link 135.

In one exemplary embodiment, the testing of the target web site (page) may provide data such as ease of access through the Internet, its attractiveness, ease of navigation, the speed with which it enables a user to complete a transaction, and the like. In another exemplary embodiment, the testing of the target web site provides data such as duration of usage, the number of keystrokes, the user's profile, and the like. It is understood that testing of a web site in accordance with embodiments of the present invention can provide other data and usability metrics. Information collected by the participant's data processing unit is uploaded to usability testing system 150 via communication link 135 for storage and analysis.

Figure 2:
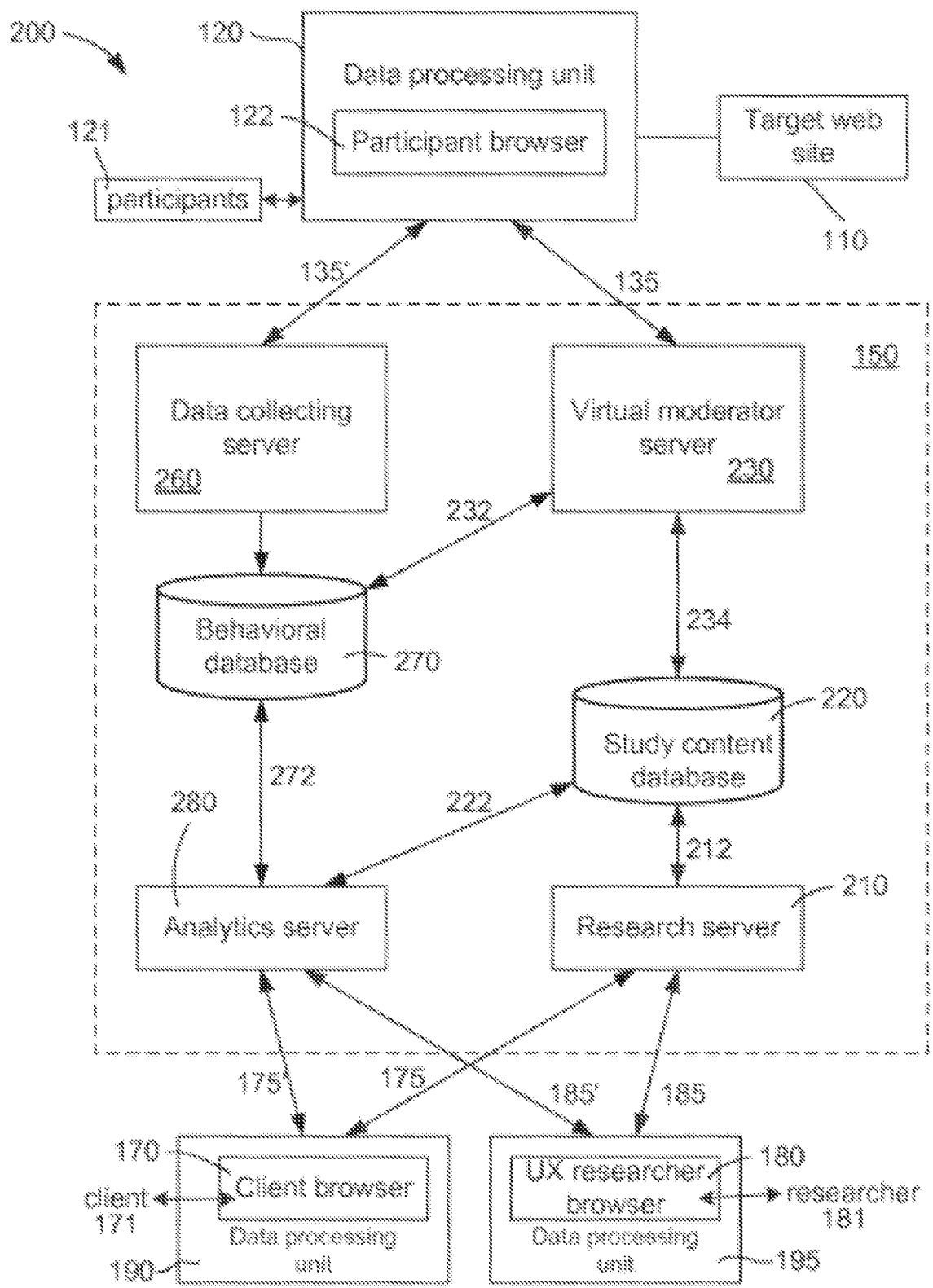
FIG. 2 is an example logical diagram of the usability testing system, in accordance with some embodiment.

FIG. 2 is a simplified block diagram of an exemplary embodiment platform 200 according to one embodiment of the present invention. Platform 200 is shown as including, in part, a usability testing system 150 being in communications with a data processing unit 125 via communications links 135 and 135'. Data processing unit 125 includes, in part, a participant browser 120 that enables a participant to access a target web site 110. Data processing unit 125 may be a personal computer, a handheld device, such as a cell phone, a smart phone or a tablet PC, or an electronic notebook. Data processing unit 125 may receive instructions and program codes from usability testing system 150 and display predefined tasks to participants 120. The instructions and program codes may include a web-based application that instructs participant browser 122 to access the target web site 110. In one embodiment, a tracking code is inserted to the target web site 110 that is being downloaded to data processing unit 125. The tracking code may be a JavaScript code that collects participants' activities on the downloaded target web site such as the number of clicks, touch events, key strokes, movements of the mouse, keywords, scrolls, time on tasks, video and audio recordings, and the like, performed over a period of time.

Data processing unit 125 may send the collected data to usability testing system 150 via communication link 135' which may be a local area network, a metropolitan area network, a wide area network, and the like and enable usability testing system 150 to establish communication with data processing unit 125 through a physical wire or wirelessly using a packet data protocol such as the TCP/IP protocol or a proprietary communication protocol.

Usability testing system 150 includes a virtual moderator software module running on a virtual moderator server 230 that conducts interactive usability testing with a usability test participant via data processing unit 125 and a research module running on a research server 210 that may be connected to a user research experience data processing unit 195. User experience researcher 181 may create tasks relevant to the usability study of a target web site and provide the created tasks to the research server 210 via a communication link 185. One of the tasks may be a set of questions designed to classify participants into different categories or to prescreen participants. Another task may be, for example, a set of questions to rate the usability of a target web site based on certain metrics such as ease of navigating the web site, connection speed, layout of the web page, ease of finding the products (e.g., the organization of product indexes). Yet another task may be a survey asking participants to press a "yes" or "no" button or write short comments about participants' experiences or familiarity with certain products and their satisfaction with the products. All these tasks can be stored in a study content database 220, which can be retrieved by the virtual moderator module running on virtual moderator server 230 to forward to participants 120. Research module running on research server 210 can also be accessed by a client (e.g., a sponsor of the usability test) 171 who, like user experience researchers 181, can design her own questionnaires since the client has a personal interest to the target web site under study. Client 171 can work together with user experience researchers 181 to create tasks for usability testing. In an embodiment, client 171 can modify tasks or lists of questions stored in the study content database 220. In another embodiment, client 171 can add or delete tasks or questionnaires in the study content database 220. In yet another embodiment, client 171 may be user experience researcher 181. The questionnaires may include open ended questions that can be analyzed either by reading the raw list of participants' replies, or by using a 'word cloud'. A word cloud is a collection of terms included in the response where common "filler" words such as "a", "is", "the", etc. are removed prior to calculating word usage frequency. More frequently used words may be displayed in a larger font than less often appearing words. Word clouds, for a large number of participants, can be visually scanned to get insights and keywords related to the study participants. These open ended questions can be placed either before a usability task (to understand expectations of the participants prior to the exercise), or after a usability task (to gather feedback about their experience on the exercise). Additionally, a text sentiment analysis algorithm may be used on the raw list of participants' replies to extract the average mood of the participants at that point of the study, or segment the participants depending on their feedback ("happy", "frustrated", etc.).

In some embodiment, one of the tasks may be open or closed card sorting studies for optimizing the architecture and layout of the target web site. Card sorting is a technique that shows how online users organize content in their own mind. In an open card sort, participants create their own names for the categories. In a closed card sort, participants are provided with a predetermined set of category names. Client 171 and/or user experience researcher 181 can create proprietary online card sorting tool that executes card sorting exercises over large groups of participants in a rapid and cost-effective manner. In an embodiment, the card sorting exercises may include up to 100 items to sort and up to 12 categories to group. One of the tasks may include categorization criteria such as asking participants questions "why do you group these items like this?". Research module on research server 210 may combine card sorting exercises and online questionnaire tools for detailed taxonomy analysis. In an embodiment, the card sorting studies are compatible with SPSS applications.

In an embodiment, the card sorting studies can be assigned randomly to participant 120. User experience (UX) researcher 181 and/or client 171 may decide how many of those card sorting studies each participant is required to complete. For example, user experience researcher 181 may create a card sorting study within 12 tasks, group them in 4 groups of 3 tasks and manage that each participant just has to complete one task of each group.

After presenting the thus created tasks to participants 120 through virtual moderator module (running on virtual moderator serer 230) and communication link 135, the actions/responses of participants will be collected in a data collecting module running on a data collecting server 260 via a communication link 135'. In an embodiment, communication link 135' may be a distributed computer network and share the same physical connection as communication link 135. This is, for example, the case where data collecting module 260 locates physically close to virtual moderator module 230, or if they share the usability testing system's processing hardware. In the following description, software modules running on associated hardware platforms will have the same reference numerals as their associated hardware platform. For example, virtual moderator module will be assigned the same reference numeral as the virtual moderator server 230, and likewise data collecting module will have the same reference numeral as the data collecting server 260.

Data collecting module 260 may include a sample quality control module that screens and validates the received responses, and eliminates participants who provide incorrect responses, or do not belong to a predetermined profile, or do not qualify for the study. Data collecting module 260 may include a "binning" module that is configured to classify the validated responses and stores them into corresponding categories in a behavioral database 270.

Merely as an example, responses may include gathered web site interaction events such as clicks, keywords, URLs, scrolls, time on task, navigation to other web pages, and the like. In one embodiment, virtual moderator server 230 has access to behavioral database 270 and uses the content of the behavioral database to interactively interface with participants 120. Based on data stored in the behavioral database, virtual moderator server 230 may direct participants to other pages of the target web site and further collect their interaction inputs in order to improve the quantity and quality of the collected data and also encourage participants' engagement. In one embodiment, virtual moderator server may eliminate one or more participants based on data collected in the behavioral database. This is the case if the one or more participants provide inputs that fail to meet a predetermined profile.

Usability testing system 150 further includes an analytics module 280 that is configured to provide analytics and reporting to queries coming from client 171 or user experience (UX) researcher 181. In an embodiment, analytics module 280 is running on a dedicated analytics server that offloads data processing tasks from traditional servers. Analytics server 280 is purpose-built for analytics and reporting and can run queries from client 171 and/or user experience researcher 181 much faster (e.g., 100 times faster) than conventional server system, regardless of the number of clients making queries or the complexity of queries. The purpose-built analytics server 280 is designed for rapid query processing and ad hoc analytics and can deliver higher performance at lower cost, and, thus provides a competitive advantage in the field of usability testing and reporting and allows a company such as UserZoom (or Xperience Consulting, SL) to get a jump start on its competitors. The performance enhancements may be further improved by having a dedicated service exclusive to the data storage functions of the system. This dedicated service inserts the data into dedicated databases, designed for receiving large video, audio and clickstream data from many sources concurrently. This dedicated database structure necessarily includes increased buffers and data storage devices that can handle massive concurrent sequential writing loads.

In an embodiment, research module 210, virtual moderator module 230, data collecting module 260, and analytics server 280 are operated in respective dedicated servers to provide higher performance. Client (sponsor) 171 and/or user experience research 181 may receive usability test reports by accessing analytics server 280 via respective links 175' and/or 185'. Analytics server 280 may communicate with behavioral database via a two-way communication link 272.

In an embodiment, study content database 220 may include a hard disk storage or a disk array that is accessed via iSCSI or Fibre Channel over a storage area network. In an embodiment, the study content is provided to analytics server 280 via a link 222 so that analytics server 280 can retrieve the study content such as task descriptions, question texts, related answer texts, products by category, and the like, and generate together with the content of the behavioral database 270 comprehensive reports to client 171 and/or user experience researcher 181.

Shown in FIG. 2 is a connection 232 between virtual moderator server 230 and behavioral database 270. Behavioral database 270 can be a network attached storage server or a storage area network disk array that includes a two-way communication via link 232 with virtual moderator server 230. Behavioral database 270 is operative to support virtual moderator server 230 during the usability testing session. For example, some questions or tasks are interactively presented to the participants based on data collected. It would be advantageous to the user experience researcher to set up specific questions that enhance the usability testing if participants behave a certain way. If a participant decides to go to a certain web page during the study, the virtual moderator server 230 will pop up corresponding questions related to that page; and answers related to that page will be received and screened by data collecting server 260 and categorized in behavioral database server 270. In some embodiments, virtual moderator server 230 operates together with data stored in the behavioral database to proceed the next steps. Virtual moderator server, for example, may need to know whether a participant has successfully completed a task, or based on the data gathered in behavioral database 270, present another tasks to the participant.

Referring still to FIG. 2, client 171 and user experience researcher 181 may provide one or more sets of questions associated with a target web site to research server 210 via respective communication link 175 and 185. Research server 210 stores the provided sets of questions in a study content database 220 that may include a mass storage device, a hard disk storage or a disk array being in communication with research server 210 through a two-way interconnection link 212. The study content database may interface with virtual moderator server 230 through a communication link 234 and provides one or more sets of questions to participants via virtual moderator server 230.

Figure 3A:
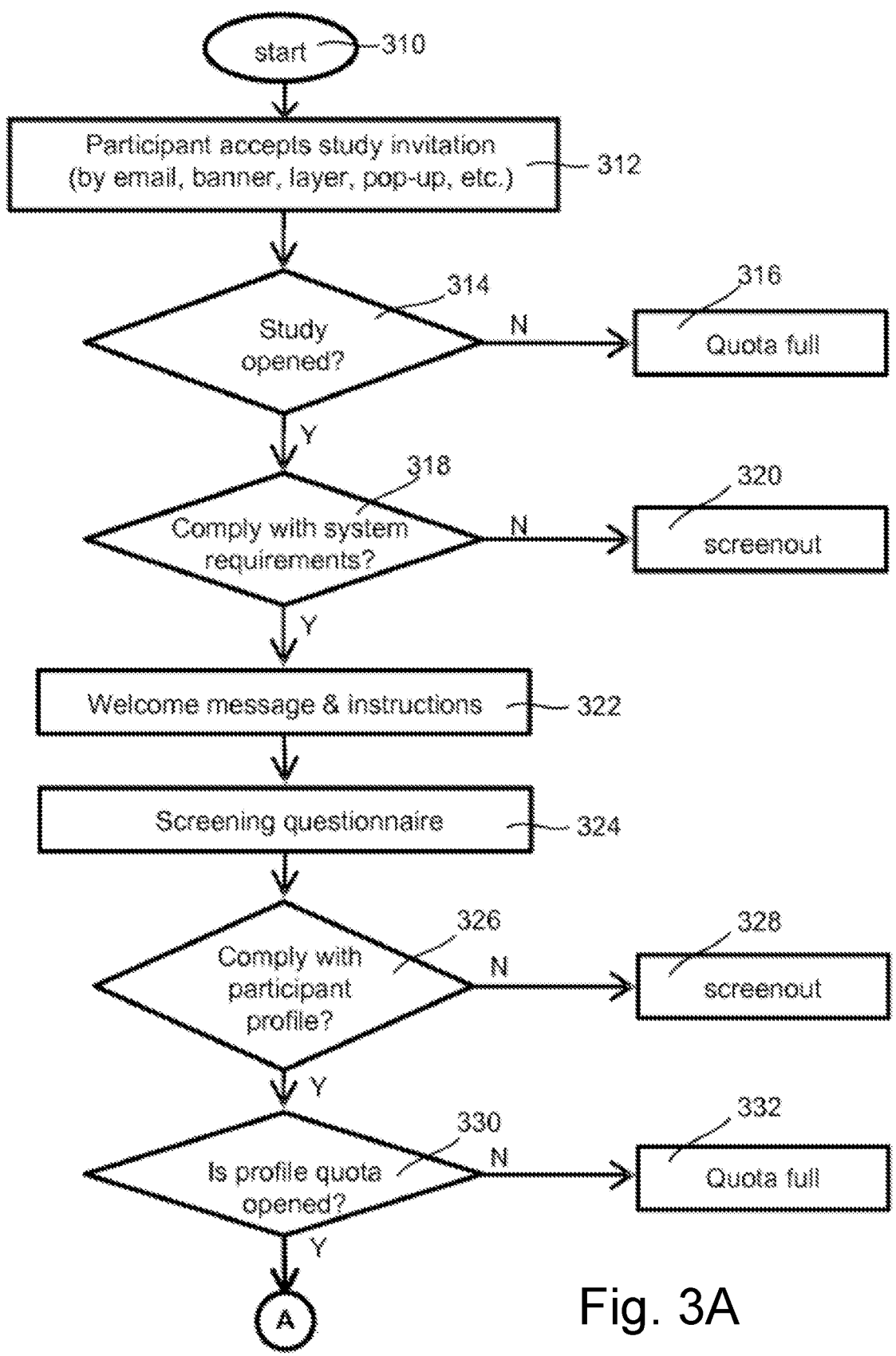
FIG. 3A is a flow diagram illustrating an exemplary process of interfacing with potential candidates and pre-screening participants for the usability testing according to an embodiment of the present invention.

FIG. 3A is a flow diagram of an exemplary process of interfacing with potential candidates and prescreening participants for the usability testing according to one embodiment of the present invention. The process starts at step 310. Initially, potential candidates for the usability testing may be recruited by email, advertisement banners, pop-ups, text layers, overlays, and the like (step 312). The number of candidates who have accepted the invitation to the usability test will be determined at step 314. If the number of candidates reaches a predetermined target number, then other candidates who have signed up late may be prompted with a message thanking for their interest and that they may be considered for a future survey (shown as "quota full" in step 316). At step 318, the usability testing system further determines whether the participants' browser comply with a target web site browser. For example, user experience researchers or the client may want to study and measure a web site's usability with regard to a specific web browser (e.g., Microsoft Edge) and reject all other browsers. Or in other cases, only the usability data of a web site related to Opera or Chrome will be collected, and Microsoft Edge or FireFox will be rejected at step 320. At step 322, participants will be prompted with a welcome message and instructions are presented to participants that, for example, explain how the usability testing will be performed, the rules to be followed, and the expected duration of the test, and the like. At step 324, one or more sets of screening questions may be presented to collect profile information of the participants. Questions may relate to participants' experience with certain products, their awareness with certain brand names, their gender, age, education level, income, online buying habits, and the like. At step 326, the system further eliminates participants based on the collected information data. For example, only participants who have used the products under study will be accepted or screened out (step 328). At step 330, a quota for participants having a target profile will be determined. For example, half of the participants must be female, and they must have online purchase experience or have purchased products online in recent years.

Figure 3B:
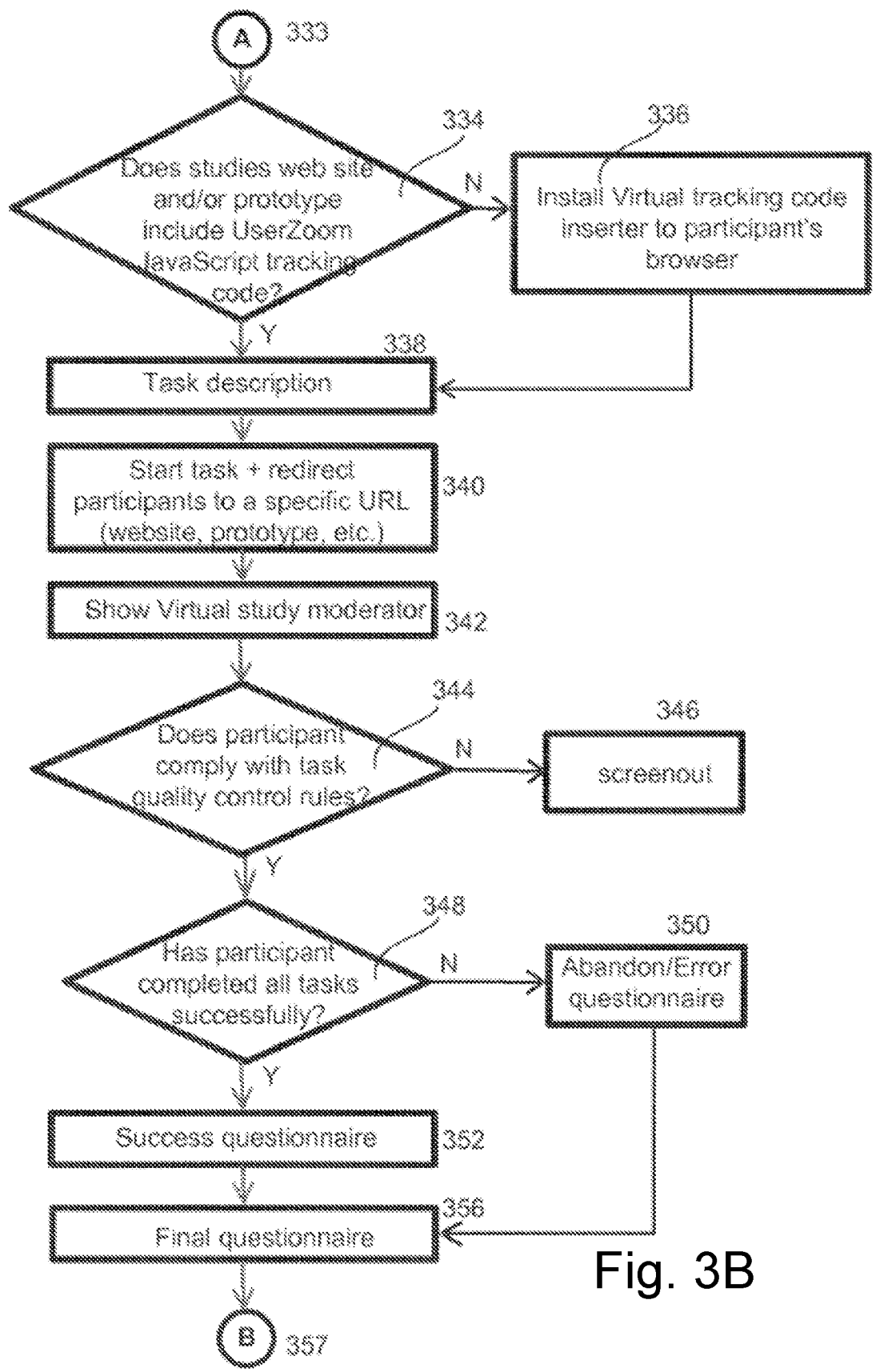
FIG. 3B is a flow diagram of an exemplary process for collecting usability data of a target web site according to an embodiment of the present invention.

FIG. 3B is a flow diagram of an exemplary process for gathering usability data of a target web site according to an embodiment of the present invention. At step 334, the target web site under test will be verified whether it includes a proprietary tracking code. In an embodiment, the tracking code is a UserZoom JavaScript code that pop-ups a series of tasks to the pre-screened participants. If the web site under study includes a proprietary tracking code (this corresponds to the scenario shown in FIG. 1C), then the process proceeds to step 338. Otherwise, a virtual tracking code will be inserted to participants' browser at step 336. This corresponds to the scenario described above in FIG. 1A.

The following process flow is best understood together with FIG. 2. At step 338, a task is described to participants. The task can be, for example, to ask participants to locate a color printer below a given price. At step 340, the task may redirect participants to a specific web site such as eBay, HP, or Amazon.com. The progress of each participant in performing the task is monitored by a virtual study moderator at step 342. At step 344, responses associated with the task are collected and verified against the task quality control rules. The step 344 may be performed by the data collecting module 260 described above and shown in FIG. 2. Data collecting module 260 ensures the quality of the received responses before storing them in a behavioral database 270 (FIG. 2). Behavioral database 270 may include data that the client and/or user experience researcher want to determine such as how many web pages a participant viewed before selecting a product, how long it took the participant to select the product and complete the purchase, how many mouse clicks and text entries were required to complete the purchase and the like. A number of participants may be screened out (step 346) during step 344 for non-complying with the task quality control rules and/or the number of participants may be required to go over a series of training provided by the virtual moderator module 230. At step 348, virtual moderator module 230 determines whether or not participants have completed all tasks successfully. If all tasks are completed successfully (e.g., participants were able to find a web page that contains the color printer under the given price), virtual moderator module 230 will prompt a success questionnaire to participants at step 352. If not, then virtual moderator module 230 will prompt an abandon or error questionnaire to participants who did not complete all tasks successfully to find out the causes that lead to the incompletion. Whether participants have completed all task successfully or not, they will be prompted a final questionnaire at step 356.

Figure 3C:
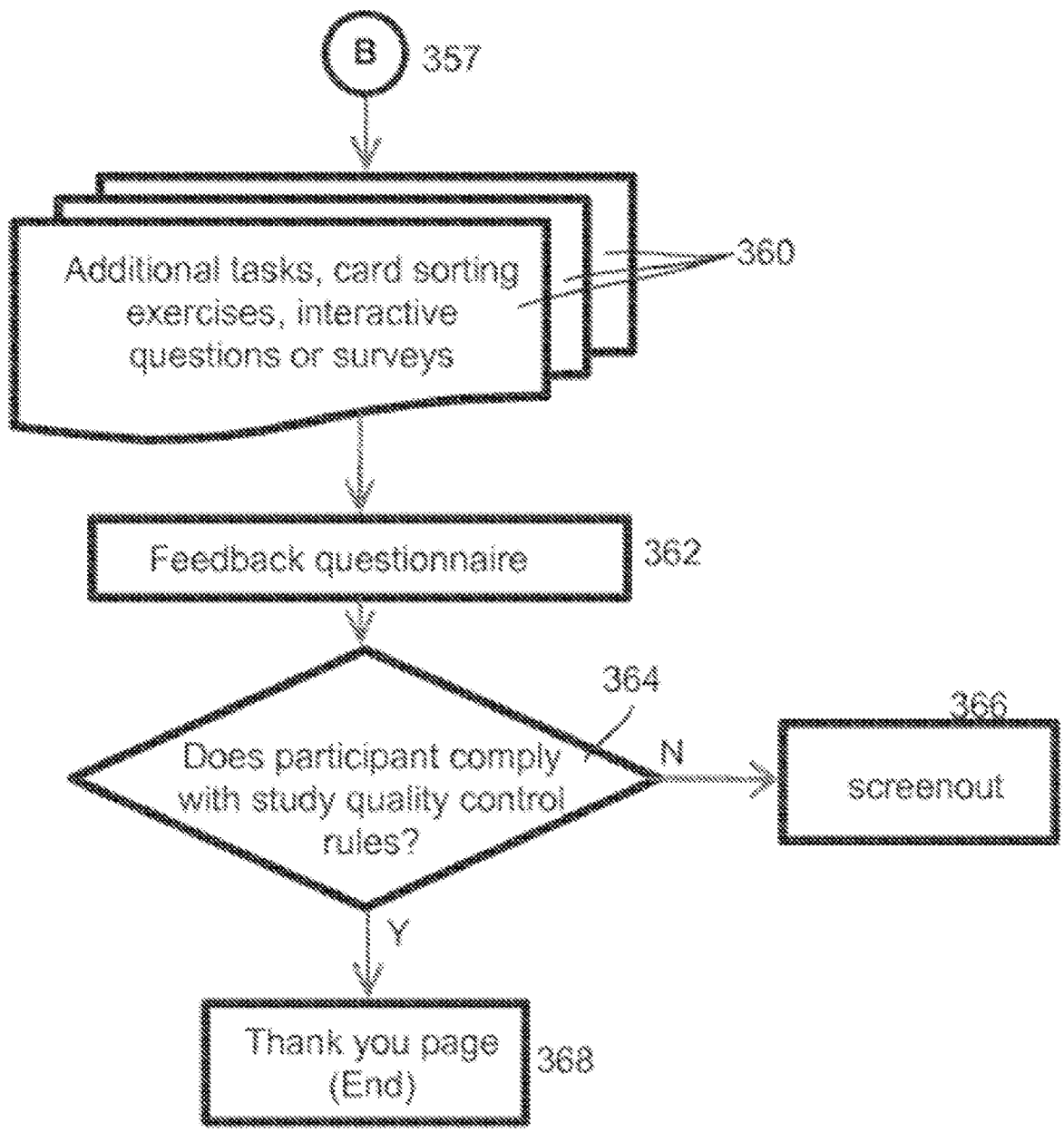
FIG. 3C is a flow diagram of an exemplary process for card sorting studies according to an embodiment of the present invention.

FIG. 3C is a flow diagram of an exemplary process for card sorting studies according to one embodiment of the present invention. At step 360, participants may be prompted with additional tasks such as card sorting exercises. Card sorting is a powerful technique for assessing how participants or visitors of a target web site group related concepts together based on the degree of similarity or a number of shared characteristics. Card sorting exercises may be time consuming. In an embodiment, participants will not be prompted all tasks but only a random number of tasks for the card sorting exercise. For example, a card sorting study is created within 12 tasks that is grouped in 6 groups of 2 tasks. Each participant just needs to complete one task of each group. It should be appreciated to one person of skill in the art that many variations, modifications, and alternatives are possible to randomize the card sorting exercise to save time and cost. Once the card sorting exercises are completed, participants are prompted with a questionnaire for feedback at step 362. The feedback questionnaire may include one or more survey questions such as a subjective rating of target web site attractiveness, how easy the product can be used, features that participants like or dislike, whether participants would recommend the products to others, and the like. At step 364, the results of the card sorting exercises will be analyzed against a set of quality control rules, and the qualified results will be stored in the behavioral database 270. In an embodiment, the analyze of the result of the card sorting exercise is performed by a dedicated analytics server 280 that provides much higher performance than general-purpose servers to provide higher satisfaction to clients. If participants complete all tasks successfully, then the process proceeds to step 368, where all participants will be thanked for their time and/or any reward may be paid out. Else, if participants do not comply or cannot complete the tasks successfully, the process proceeds to step 366 that eliminates the non-compliant participants.

Figure 4:
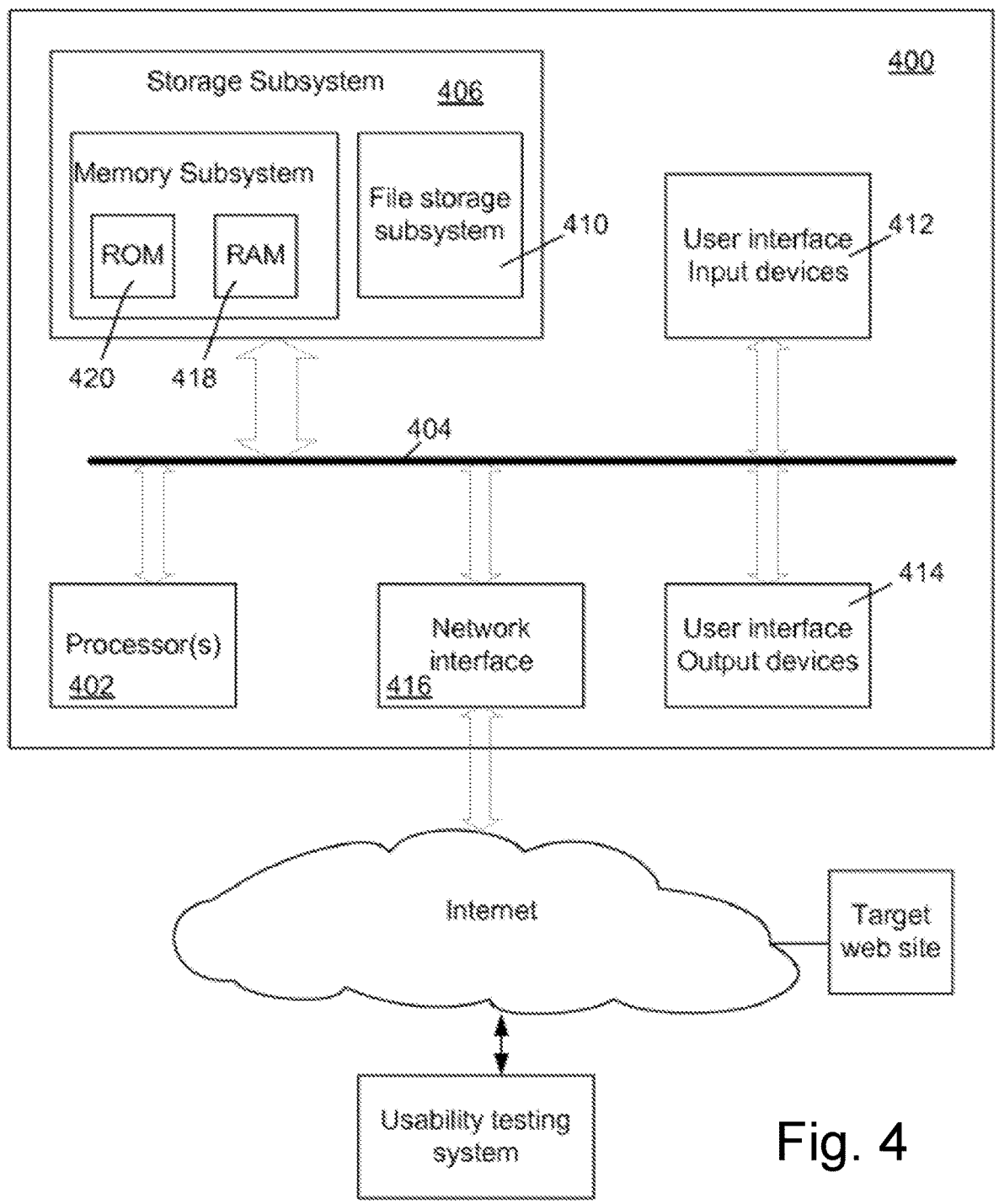
FIG. 4 is a simplified block diagram of a data processing unit configured to enable a participant to access a web site and track participant's interaction with the web site according to an embodiment of the present invention.

FIG. 4 illustrates an example of a suitable data processing unit 400 configured to connect to a target web site, display web pages, gather participant's responses related to the displayed web pages, interface with a usability testing system, and perform other tasks according to an embodiment of the present invention. System 400 is shown as including at least one processor 402, which communicates with a number of peripheral devices via a bus subsystem 404. These peripheral devices may include a storage subsystem 406, including, in part, a memory subsystem 408 and a file storage subsystem 410, user interface input devices 412, user interface output devices 414, and a network interface subsystem 416 that may include a wireless communication port. The input and output devices allow user interaction with data processing system 402. Bus system 404 may be any of a variety of bus architectures such as ISA bus, VESA bus, PCI bus and others. Bus subsystem 404 provides a mechanism for enabling the various components and subsystems of the processing device to communicate with each other. Although bus subsystem 404 is shown schematically as a single bus, alternative embodiments of the bus subsystem may utilize multiple busses.

User interface input devices 412 may include a keyboard, pointing devices such as a mouse, trackball, touchpad, or graphics tablet, a scanner, a barcode scanner, a touch screen incorporated into the display, audio input devices such as voice recognition systems, microphones, and other types of input devices. In general, use of the term input device is intended to include all possible types of devices and ways to input information to processing device. User interface output devices 414 may include a display subsystem, a printer, a fax machine, or non-visual displays such as audio output devices. The display subsystem may be a cathode ray tube (CRT), a flat-panel device such as a liquid crystal display (LCD), or a projection device. In general, use of the term output device is intended to include all possible types of devices and ways to output information from the processing device.

Storage subsystem 406 may be configured to store the basic programming and data constructs that provide the functionality in accordance with embodiments of the present invention. For example, according to one embodiment of the present invention, software modules implementing the functionality of the present invention may be stored in storage subsystem 406. These software modules may be executed by processor(s) 402. Such software modules can include codes configured to access a target web site, codes configured to modify a downloaded copy of the target web site by inserting a tracking code, codes configured to display a list of predefined tasks to a participant, codes configured to gather participant's responses, and codes configured to cause participant to participate in card sorting exercises. Storage subsystem 406 may also include codes configured to transmit participant's responses to a usability testing system.

Memory subsystem 408 may include a number of memories including a main random access memory (RAM) 418 for storage of instructions and data during program execution and a read only memory (ROM) 420 in which fixed instructions are stored. File storage subsystem 410 provides persistent (non-volatile) storage for program and data files, and may include a hard disk drive, a floppy disk drive along with associated removable media, a Compact Disk Read Only Memory (CD-ROM) drive, an optical drive, removable media cartridges, and other like storage media.

Figure 5:
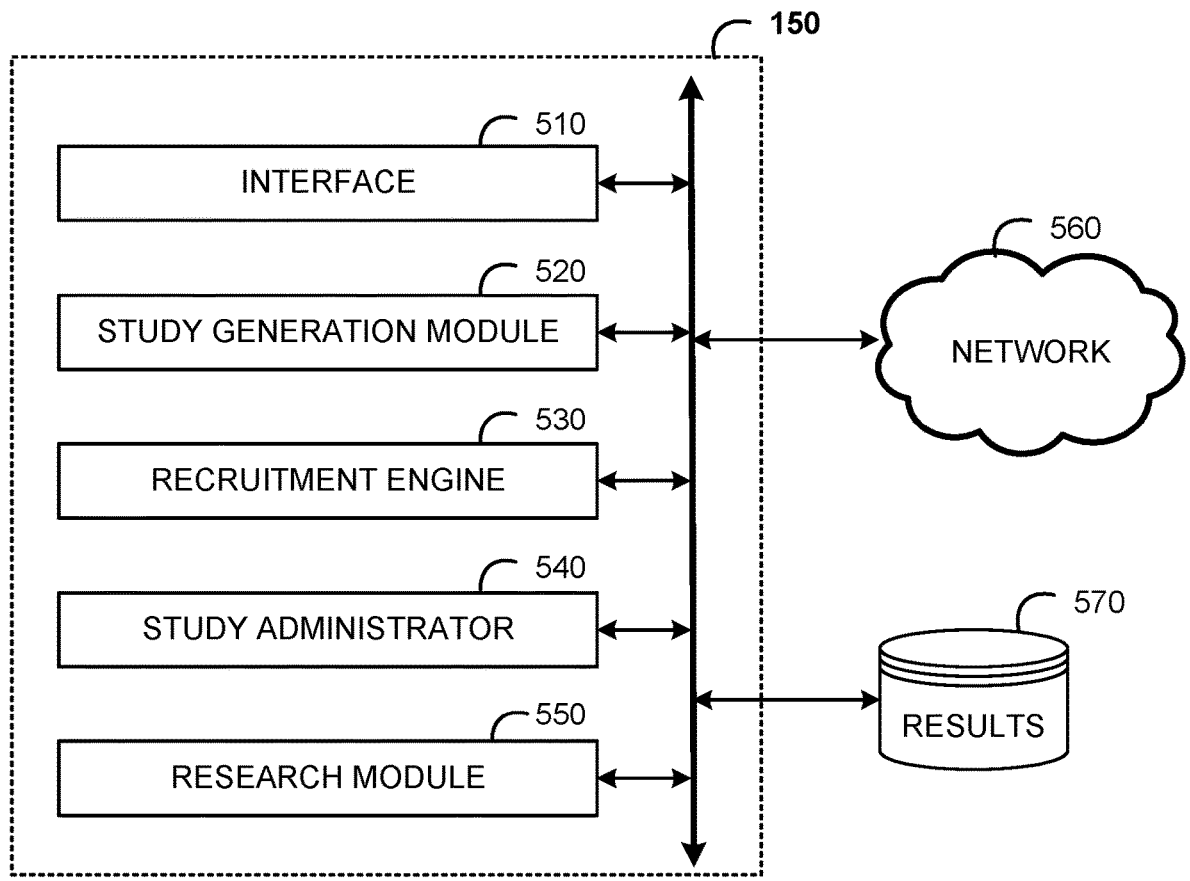
FIG. 5 is an example logical diagram of a second substantiation of the usability testing system, in accordance with some embodiment.

Now that systems and methods of usability testing have been described at a high level, attention will be directed to a particular set of embodiments of the systems and methods for user experience testing that allows for advanced insight generation. This begins with a usability testing system 150 as seen in relation to FIG. 5. In this substantiation of the usability testing system 150 a number of subcomponents are seen as logically connected with one another, including an interface 510 for accessing the results 570 which may be stored internally or in an external data repository. The interface is also configured to couple with the network 560, which most typically is the Internet, as previously discussed.

The other significant components of the user experience testing system 150 includes a study generation module 520, a recruitment engine 530, a study administrator 540 and a research module 550, each of which will be described in greater detail below. Each of the components of the user experience testing systems 150 may be physically or logically coupled, allowing for the output of any given component to be used by the other components as needed.

Figure 6:
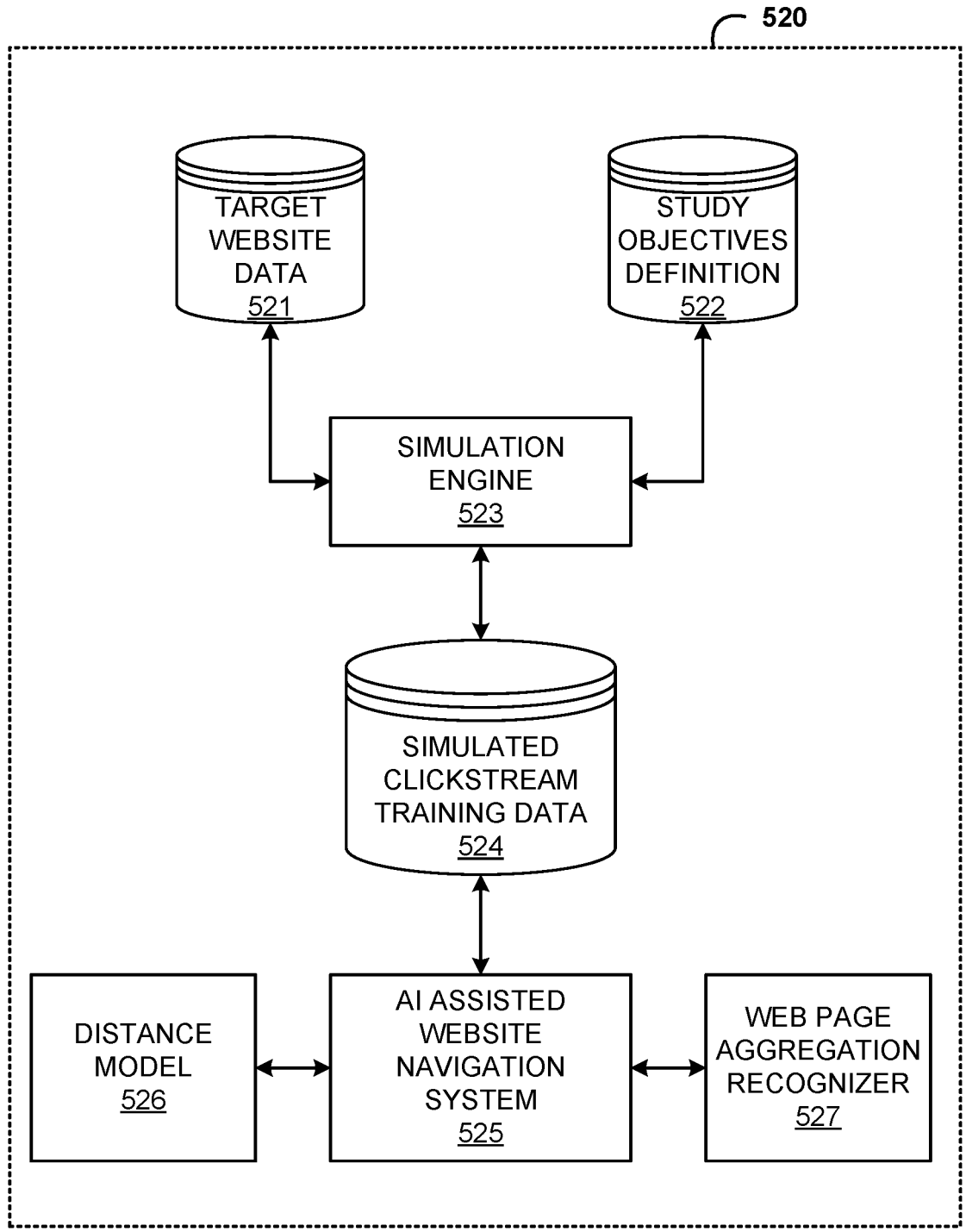
FIG. 6 is a logical diagram of the study generation module which includes an AI assisted digital interface navigation system, in accordance with some embodiment.

Turning to FIG. 6, the study generation module 520 is provided in greater detail. Data 521 regarding the targeted digital interface being tested, and study objective data 522 is provided to a simulation engine 523 which generates simulated clickstreams for the given objective. This process operates in parallel to the actual administration of testing by using the objective data 522. A clickstream includes the sequence of links a user clicks on, on a basic level, and may further include sequences of touch events, voice events, or even movement events (dependent upon the interface of the device being accessed by the user).

The actual testing results in a significant corpus of data being generated by the participants, which is made available for downstream analytics by the research module 550. The study objectives 522 includes the specific activities that the participants are expected to complete on the target website or other digital interface. The participant navigates through the website or other digital interface in an effort to achieve these study objectives. The results are used to identify "confusion points" or areas of website, or other digital interface, navigation where it is unclear to the participant the 'correct' way to proceed/achieve the objective.

In the creation of the clickstream simulations, at the time the study is generated, the target website data 521 links the web page of the target website, or other digital interface, 110 that is stored in this database. This data defines possible navigation routes between the web pages in the target website, or other digital interface, 110, and in some embodiments, may further contain images of individual webpages. The simulation engine 523 uses a variety of random and non-random search methods to explore and document the state space of the target website, or other digital interface, 110. For example, it is possible to build a graph representation of the website, or other digital interface, by explicitly analyzing all of the links in each page and adding them as edges between different nodes, which represent individual web pages, in the graph. This is an example of a non-random search and exploration method. Another search strategy is to randomly choose a link from each web page and then follow that link to a new page. By randomly generating and documenting many paths through the website, it is possible to build up a database of web pages and links. This would be a random search methodology. There are many such methods available for exploring such environments, including methods that combine random and non-random algorithms. These clickstream training data 524 can then be used to build automated strategies for achieving each study objective using algorithmic methods including machine learning such as reinforcement learning and linear programming. For example, if reinforcement learning were applied to this problem, an agent would be trained to develop a strategy for finding the most efficient path from any point in a trajectory through the website, or other digital interface, to the study objective. During training, the algorithm would receive a reward for achieving the objective, but would be penalized proportionally to the number of steps taken to receive the reward, resulting in an algorithm that can automatically characterize the "distance" (for example in steps) to the objective from any point in the website state space.

The simulated clickstream training data 524 generated by the simulation engine 523 is utilized to train machine learning models or AI models for a number of downstream analytics, as will be described in greater detail further below. The simulated clickstream training data 524 is generated either as an asynchronous batch dataset for a specific study objective, or can be generated iteratively according to the needs of the AI assisted website navigation system 525. In some cases, it is most efficient to generate a large database of information about the structure of a website, or other digital interface, (for example a graph of the website as described above) which can then be used to train an algorithm that can automatically navigate the website, or other digital interface,. This would be an asynchronous batch dataset. For example, for tasks with few steps required to complete them or for websites with relatively few outgoing links per page, it is possible and potentially advantageous to collect comprehensive data about the website before beginning algorithm training. In other cases, it may be more efficient to allow the training algorithm to request simulation data for different parts of the network as these regions of the state space are explored, obviating the need to simulate all of the website, or other digital interface, or to store a prohibitively large amount of data. This would be an iterative dataset involving an interaction between the training module and the simulation module.

The website navigation system 525 is used to train an algorithm to automatically navigate the target website, or other digital interface, 110 in order to determine the most efficient path to achieve a study objective from any location in the state space of the target website, or other digital interface, 110. This means that regardless of the path a participant takes while attempting to achieve the study objective, algorithms trained in this phase can automatically determine how to achieve the objective, and how many actions (e.g., clicks, new pages, data selections, dropdown actions, etc.) the user is from achieving the study objective by the most efficient path possible at that given state. Furthermore, in some embodiments images of web pages are used in the training, which results in an algorithm that can identify its location within the target website, or other digital interface, 110 structure, which has is usable by a web page aggregation recognizer 527. In some embodiments, models can be implemented via Reinforcement Learning ("RL") algorithms which have the advantage of maintaining a map of the distance of each state space location to the desired study objective. While this is only one of many possible algorithmic approaches to the AI-assisted navigation problem, it has the advantage that, once the model is trained, the determination of the distance is computationally very efficient.

A distance modeler 526 is the result of this training of the algorithm to automatically find the most efficient path from a location in the target website, or other digital interface 110 (a "state space" location) to a study objective. As noted above, in some embodiments, this is carried out by a Reinforcement Learning algorithm, but many other potential models can be used for this purpose. The "distance" (as measured for example by clicks, web pages navigated, time of information to be entered into the web page, as examples) to the study objective can be computed for each location in the state space and it can be quantitatively determined when the user is moving "away" from the Study Objective.

In some embodiments, the distance is not merely a number of actions the participant must perform to get to the study objective, but rather a weighted score for each action. This weighting may depend upon time taken for the given action (as measured from empirical study results), or action "difficulty", which is a statistical measure of how intuitive or likely an action is. This 'difficulty' weight may likewise be a measured quantity based upon the percentage of the time a set of participants actually takes the given action. As such a 'difficulty' metric benefits from many data points, it may further be generated by looking at all user traffic on the target website (not just participant traffic) over a given timeframe. The probability the action is taken (number of times the action is taken from that 'location' on the website, or other digital interface, divided by the total set of actions taken by the relevant individuals which eventually results in reaching the objective) may be used as this 'difficulty' weight. Regardless of whether the weighing factor is by time taken or difficulty, this may be used as a relative score for the given action. For example, if the objective is to find a specific type of laptop computer on a retailer website, the user may select "laptops" from a pulldown menu, and then filter the results by brand and CPU type. This is three distinct actions, but each action is a low difficulty and takes little time. In contrast, the user could perform a search for "Dell laptop Intel i5-8250u" which would likewise result in the study objective being met. This one action, however, takes a while to type in comparison to selecting from a dropdown menu and selecting two check-box filters. Likewise, most users won't intuitively enter such a typed search, and thus such an action is a significantly larger 'difficulty'. Thus, while this method of getting to the objective has a closer distance in terms of raw actions taken, it may actually have a larger distance if a weighted distance algorithm is employed (either time or difficulty weighting).

Regardless of the distance model employed (raw action number, time weighted, or difficulty weighted) periods of a study in which a participant either moves significantly away from the study objective, or when the participant fails to make progress toward the study objective for a significant period of time (or number of clicks) indicate "confusion points." The detection and removal of confusion points is a key goal of user experience testing, thus this distance modeler 526 is a critical element in the reduction of the process to collect quantitative data that can be used for machine learning and AI automation of the process.

It should be noted that while clickstream data provides a wealth of information for usability analytics, the incorporation of insights gained from video and audio recordings of the participants greatly increases the value of this data. The collected data (be it clickstreams, video, audio, etc.) is analyzed in light of the fact that the exact goal of the participant is known, further enhancing the analysis. For example, by detecting a happy emotion in the participant via facial recognition software performed on the video data, while navigating through the digital interface, the system is able to detect a successful pattern of behavior and a good user experience (same with voice recognition patterns). The "clicks", screen recording, the voice, the face emotions, the answers provided, and sentiment analysis applied to audio transcripts further allow the system to model better experiences.

Furthermore, the AI module may receive recordings of a series of studies for a particular digital interface. These recordings are used to train the AI model used by the module. The success rates for a given objective are used as inputs along with the state of the digital interface. For example, the location of a search bar may vary between two differing digital interfaces. In the first interface the success rates are much faster and frequent. For this overly simplified example, the AI model would learn that the first location of the search bar results in an increased success rate by a set percentage. These machine learning models are particularly adept at taking in a very large number of inputs (such as video recordings that signify emotions, exact layouts, colors and sizing of interface elements, audio ques from the recordings, click pathways and the like), and distilling out predictive models for the outcome.

With these models thus trained, a prototype interface may be provided to the AI model, and the degree of success or failure for this new interface may be readily determined. The model can also identify elements within the prototype that if altered would provide an increased likelihood of successful completion of the objective. Likewise, failure points within the prototype can be flagged for removal or updating. In this manner, a new interface may be pre-tested by the AI module before it is even released for studies. This can significantly reduce the number of studies needed to be performed, which is extremely cost effective.

Returning to FIG. 5, another use of the distance modeler 526 is to characterize the aggregate likelihood at each point in the state space that the participant will take a "high-value" step. In other words, there are many navigation choices on each web page, and given how the participant navigated to that point, there will be preferred next steps. By characterizing the frequency with which users took desirable steps (or alternatively the average "value" of the steps taken by users at each point), it is possible to identify which web pages are most likely to lead to errors, and therefore may need to be improved by the client.

The web page aggregation recognizer 527 includes a model that is trained to recognize a web page in the target website, or other digital interface 110, and to recognize the possible actions available to a user on that page, without reference to the text URL and regardless of the presence of advertising and other variable images on the page. In some embodiments, this capability can be a valuable component in the training of the distance model of the distance modeler 527. The web page aggregation recognizer 527 solves another problem in the creation of useful analytics and visualizations: operators create clickstream maps that show the most common flows through the target website, or other digital interface, 110, but these analyses are complicated by the fact that the same web page can be labeled by multiple URLs and are therefore not aggregated to correctly show the flow patterns. The web page aggregation recognizer 527 uses AI image recognition to automatically recognize each page in the target website, or other digital interface, 110, even if it is identified by a different URL and even if it is displaying random and/or unpredictable image content such as web ads, allowing for a more accurate aggregation to be accomplished. In some embodiments, the algorithm effectively learns which information is 'important' in each web page and which information is meaningless advertising content.

Figure 7:
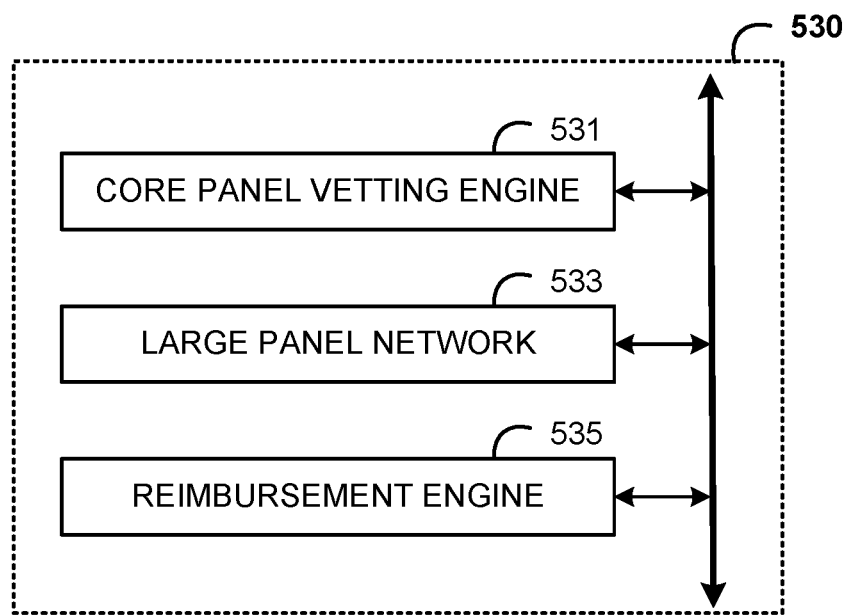
FIG. 7 is a logical diagram of the recruitment engine, in accordance with some embodiment.

Turning now to FIG. 7, a more detailed illustration of the recruitment engine 530 is provided. The recruitment engine 530 is responsible for the recruiting and management of participants for the studies. Generally, participants are one of three different classes: 1) core panel participants, 2) general panel participants, and 3) client provided participants. The core panel participants are compensated at a greater rate, but must first be vetted for their ability and willingness to provide comprehensive user experience reviews. Significant demographic and personal information can be collected for these core panel participants, which can enable powerful downstream analytics. The core panel vetting engine 531 collects public information automatically for the participants as well as eliciting information from the participant to determine if the individual is a reliable panelists. Traits like honesty and responsiveness may be ascertained by comparing the information derived from public sources to the participant supplied information. Additionally, the participant may provide a video sample of a study. This sample is reviewed for clarity and communication proficiency as part of the vetting process. If a participant is successfully vetted they are then added to a database of available core panelists. Core panelists have an expectation of reduced privacy, and may pre-commit to certain volumes and/or activities.

Beyond the core panel is a significantly larger pool of participants in a general panel participant pool. This pool of participants may have activities that they are unwilling to engage in (e.g., audio and video recording for example), and are required to provide less demographic and personal information than core panelists. In turn, the general panel participants are generally provided a lower compensation for their time than the core panelists. Additionally, the general panel participants may be a shared pooling of participants across many user experience and survey platforms. This enables a demographically rich and large pool of individuals to source from. A large panel network 533 manages this general panel participant pool.

Lastly, the user or client may already have a set of participants they wish to use in their testing. For example, if the user experience for an employee benefits portal is being tested, the client will wish to test the study on their own employees rather than the general public.

A reimbursement engine 535 is involved with compensating participants for their time (often on a per study basis). Different studies may be 'worth' differing amounts based upon the requirements (e.g., video recording, surveys, tasks, etc.) or the expected length to completion. Additionally, the compensation between general panelists and core panelists may differ even for the same study. Generally, client supplied participants are not compensated by the reimbursement engine 535 as the compensation (if any) is directly negotiated between the client and the participants.

Figure 8:
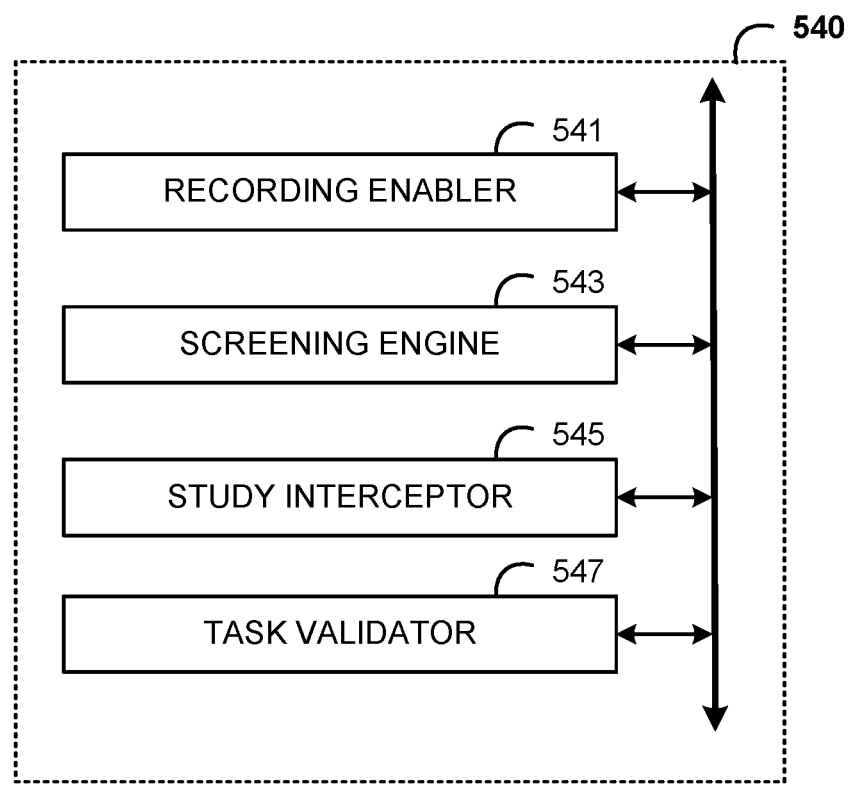
FIG. 8 is a logical diagram of the study administrator, in accordance with some embodiment.

Turning now to FIG. 8, a more detailed view of the study administrator 540 is provided. Unlike many other user experience testing programs, the presently disclosed systems and methods include the ability to record particular activities by the user. A recording enabler 541 allows for the collection of click-flow information, audio collection and even video recording. In the event of audio and/or video recording the recording only occurs during the study in order to preserve participant privacy, and to focus attention on only time periods that will provide insights into the user experience. Thus, while the participant is engaged in screening questions or other activities recording may be disabled to prevent needless data accumulation. Recording only occurs after user acceptance (to prevent running afoul of privacy laws and regulations), and during recording the user may be presented with a clear indication that the session is being recorded. For example the user may be provided a thumbnail image of the video capture, in some embodiments. This provides notice to the user of the video recording, and also indicates video quality and field of view information, thereby allowing them to readjust the camera if needed or take other necessary actions (avoiding harsh backlight, increasing ambient lighting, etc.).

The screening engine 543 administers the generated screener questions for the study. Screener questions, as previously disclosed, includes questions to the potential participants that may qualify or disqualify them from a particular study. For example, in a given study, the user may wish to target men between the ages of 21 and 35, for example. Questions regarding age and gender may be used in the screener questions to enable selection of the appropriate participants for the given study. Additionally, based upon the desired participant pool being used, the participants may be pre-screened by the system based upon known demographic data. For the vetted core panelists the amount of personal data known may be significant, thereby focusing in on eligible participants with little to no additional screener questions required. For the general panel population, however, less data is known, and often all but the most rudimentary qualifications may be performed automatically. After this qualification filtering of the participants, they may be subjected to the screener questions as discussed above.

In some embodiments it may be desirable to interrupt a study in progress in order to interject a new concept, offer or instruction. Particularly, in a mobile application there can be a software developer kit (SDK) that enables the integration into the study and interruption of the user in-process. The study interceptor 545 manages this interruptive activity. Interruption of the user experience allows for immediate feedback testing or prompts to have the participant do some other activity.

Lastly, the study may include one or more events to occur in order to validate its successful completion. A task validator 547 tracks these metrics for study completion. Generally, task validation falls into three categories: 1) completion of a particular action (such as arriving at a particular URL, URL containing a particular keyword, or the like), 2) completing a task within a time threshold (such as finding a product that meets criteria within a particular time limit), and 3) by question. Questions may include any definition of success the study designer deems relevant. This may include a simple "were you successful in the task?" style question, or a more complex satisfaction question with multiple gradient answers, for example.

Figure 9:
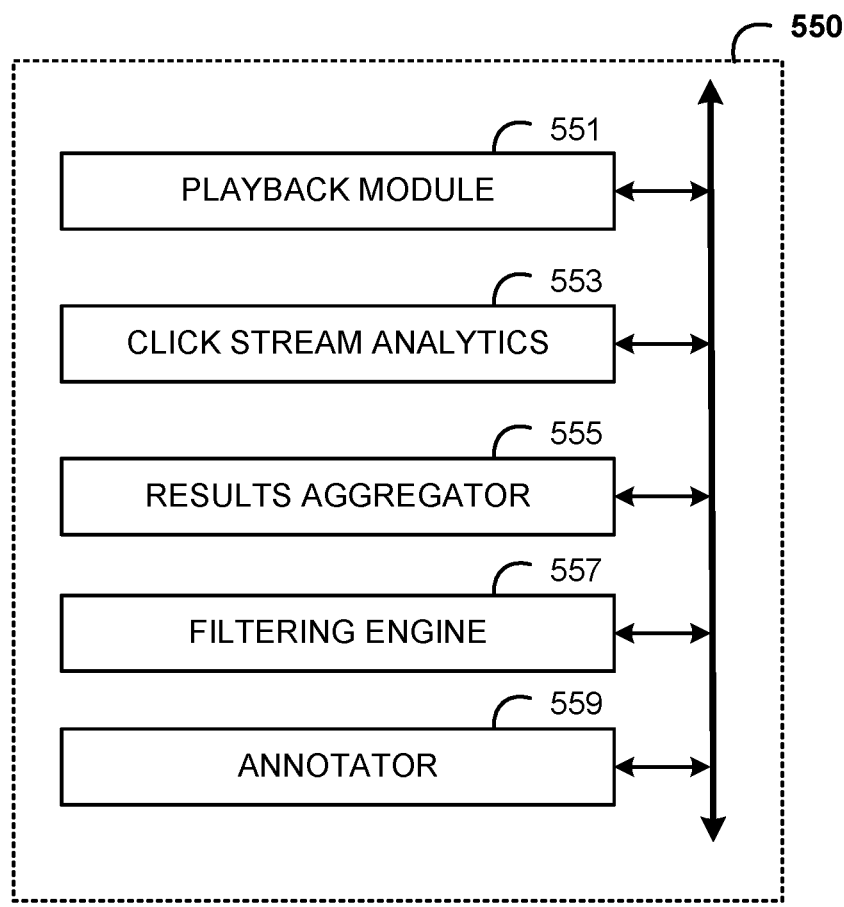
FIG. 9 is a logical diagram of the research module, in accordance with some embodiment.

Turning now to FIG. 9, the research module 550 is provided in greater detail. Compared to traditional user experience study platforms, the present systems and methods particularly excel at providing timely and accurate insights into a user's experience, due to these research tools. The research module includes basic functionalities, such as playback of any video or audio recordings by the playback module 551. This module, however, may also include a machine transcription of the audio, which is then time synchronized to the audio and/or video file. This allows a user to review and search the transcript (using keywords or the like) and immediately be taken to the relevant timing within the recording. All of the results may be annotated using an annotator 559 as well. This allows, for example the user to select a portion of the written transcription and provide an annotation relevant to the study results. The system then automatically can use the timing data to generate an edited video/audio clip associated with the annotation. If the user later searches the study results for the annotation, this auto-generated clip may be displayed for viewing. Since transcription is automatically done, a huge amount of data can be finally given to a stakeholder. From user experience perspective, only a small amount of this data is relevant, so a separate AI module can give the user the insights about where and when the interesting things happen. For example, semantic analysis can identify relevant reactions from participants, when they think they succeeded in a particular task or when they abandon it, utterances of particular terms of interest, etc.

The AI module may include models that are capable of filtering through study results in order to distill out insights that assist in the review of the recorded studies. This is achieved by first feeding the AI model a training set composed of annotated study results. These annotations include identification of points of interest, such as the user being angry or happy or frustrated, or when a user abandons the task, or fails to achieve the given objective. Other incidents of interest could also include when the user has an epiphany that results in task completion, delays in task completion, or failure to identify a product or region of the interface.

Once trained to identify these incidents of interest, the AI algorithm may be fed additional training in terms of feedback from a human operator regarding what data is useful and relevant regarding the incidents of interest. For example, suppose a user is unable to find a product, and selects a tab for the wrong category of product. The AI model may initially provide a long video segment, a heat map and a clickstream. The reviewer may find the video relevant but not useful, the heat map also of little use, but the clickstream of particular help. In later incidents when this scenario is encountered, the AI model may instead provide a more truncated video clip around the last 20 seconds before the user selects the incorrect tab, and the clickstream information, but may omit the heat map. This time the user indicates that the outputs are extremely helpful, and the AI model learns in such a manner to output only analytical results that are best suited (most wanted by the reviewer) for analysis. Analytics output can include heat maps, clickstreams, word clouds, video and/or audio clips, sentiment analysis results, a question chart with confidence intervals, and the like.

In some embodiments, after the AI models are thus trained, a set of studies are received. The model may then immediately analyze the study recordings for incidents of interest. In order to save on computational resources, it may not be necessary to identify the triggers, or generate outputs at this time. Instead the system may wait for a query from the reviewer asking about a particular type of incident. This query may include selection from a predefined type of desired insight, or may even be a natural language type of query.

After the query is received, the system may select for the incidents of interest already identified that are related to the query. Subsequently, the triggers for the incidents are identified and output as detailed above. Additional feedback from the reviewer may assist in further refining the models, and may result in additional or alternative analytical outputs being presented.

Returning to FIG. 5, in addition to the video and/or audio recordings, the clickstream for the participant is recorded and mapped out as a branched tree, by the click stream analyzer 553. This may be aggregated with other participants' results for the study, to provide the user an indication of what any specific participant does to complete the assigned task, or some aggregated group generally does. The results aggregator 555 likewise combines task validation findings into aggregate numbers for analysis.

All results may be searched and filtered by a filtering engine 557 based upon any delineator. For example, a user may desire to know what the pain points of a given task are, and thus filters the results only by participants that failed to complete the task. Trends in the clickstream for these individuals may illustrate common activities that result in failure to complete the task. For example, if the task is to find a laptop computer with a dedicated graphics card for under a set price, and the majority of people who fail to successfully complete this task end up stuck in computer components due to typing in a search for "graphics card" this may indicate that the search algorithm requires reworking to provide a wider set of categories of products, for example.

As noted above, the filtering may be by any known dimension (not simply success or failure events of a task). For example, during screening or as part of a survey attending the study, income levels, gender, education, age, shopping preferences, etc. may all be discovered. It is also possible that the participant pool includes some of this information in metadata associated with the participant as well. Any of this information may be used to drill down into the results filtering. For example it may be desired to filter for only participants over a certain age. If after a certain age success rates are found to drop off significantly, for example, it may be that the font sizing is too small, resulting in increased difficulty for people with deteriorating eyesight.

Likewise, any of the results may be subject to annotations. Annotations allow for different user reviewers to collectively aggregate insights that they develop by reviewing the results, and allows for filtering and searching for common events in the results.

All of the results activities are additionally ripe for machine learning analysis using deep learning. For example, the known demographic information may be fed into a recursive neural network (RNN) or convolutional neural network (CNN) to identify which features are predictive of a task being completed or not. Even more powerful is the ability for the clickstream to be fed as a feature set into the neural network to identify trends in click flow activity that are problematic or result in a decreased user experience.

Figure 10:
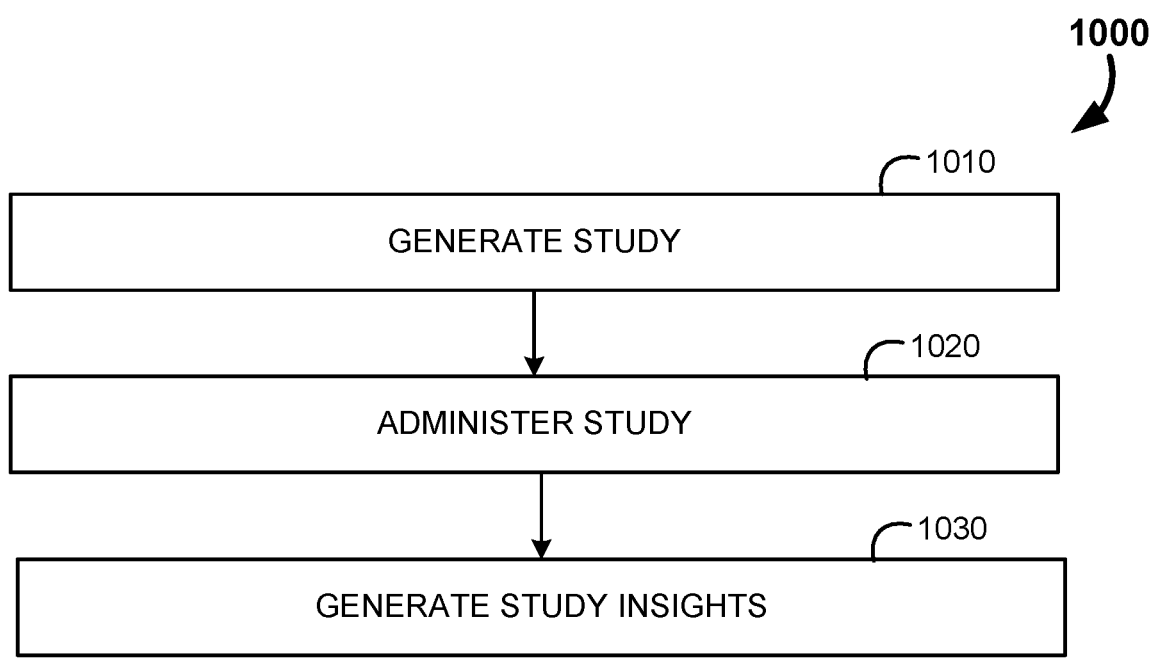
FIG. 10 is a flow diagram for an example process of user experience testing, in accordance with some embodiment.

Turning now to FIG. 10, a flow diagram of the process of user experience study testing is provided generally at 1000. At a high level this process includes three basic stages: the generation of the study (at 1010) the administration of the study (at 1020) and the generation of the study insights (at 1030). Earlier FIGS. 3A-C touched upon the study administration, and is intended to be considered one embodiment thereof.

Figure 11:
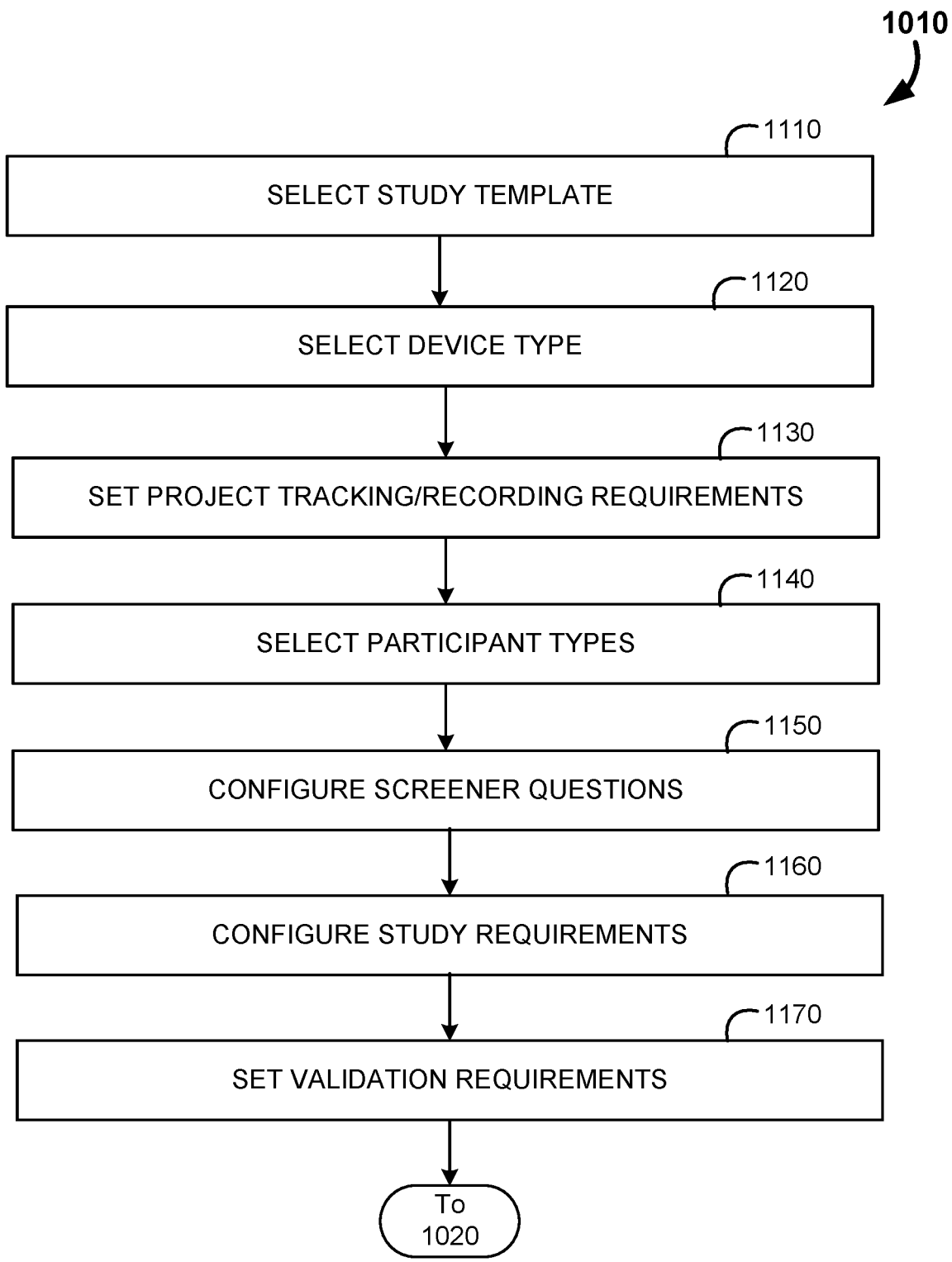
FIG. 11 is a flow diagram for the example process of study generation, in accordance with some embodiment.

FIG. 11 provides a more detailed flow diagram of the study generation 1010. As noted before, the present systems and methods allows for improved study generation by the usage of study templates which are selected (at 1110) based upon the device the study is to be implemented on, and the type of study that is being performed. Study templates may come in alternate languages as well, in some embodiments. Study types generally include basic usability testing, surveys, card sort, tree test, click test, live intercept and advanced user insight research. The basic usability test includes audio and/or video recordings for a relatively small number of participants with feedback. A survey, on the other hand, leverages large participant numbers with branched survey questions. Usability tests with audio and/or video recordings are usually time-consuming to analyze because the whole video has to be watched to extract conclusions. Automated audio and video analysis helps identify key events during the session so that the researcher only needs to look at a small but relevant part of the video, or read a small but relevant part of the transcript (curated snippets). When analysis time is optimized in this way, larger samples may be used for these studies, which will lead to more robust results. Surveys may also include randomization and double blind studies. Card sort, as discussed in great detail previously, includes open or closed card sorting studies. Tree tests assess the ease in which an item is found in a website menu by measuring where users expect to locate specific information. Click test measures first impressions and defines success areas on a static image as a heat map graph. Lastly, advanced research includes a combination of the other methodologies with logical conditions and task validation, and is the subject of much of the below discussions. Each of these study types includes separate saved template designs.

Device type is selected next (at 1120). As noted before, mobile applications enable SDK integration for user experience interruption, when this study type is desired. Additionally, the device type is important for determining recording ability.

The study tracking and recording requirements are likewise set (at 1130). Further, the participant types are selected (at 1140). The selection of participants may include a selection by the user to use their own participants, or rely upon the study system for providing qualifies participants. If the study system is providing the participants, a set of screener questions are generated (at 1150). These screener questions may be saved for later usage as a screener profile. The core participants and larger general panel participants may be screened until the study quota is filled.

Next the study requirements are set (at 1160). Study requirements may differ based upon the study type that was previously selected. For example, the study questions are set for a survey style study, or advanced research study. In basic usability studies and research studies the task may likewise be defined for the participants. For tree tests the information being sought is defined and the menu uploaded. For click test the static image is selected for usage. Lastly, the success validation is set (at 1170) for the advanced research study.

Figure 12:
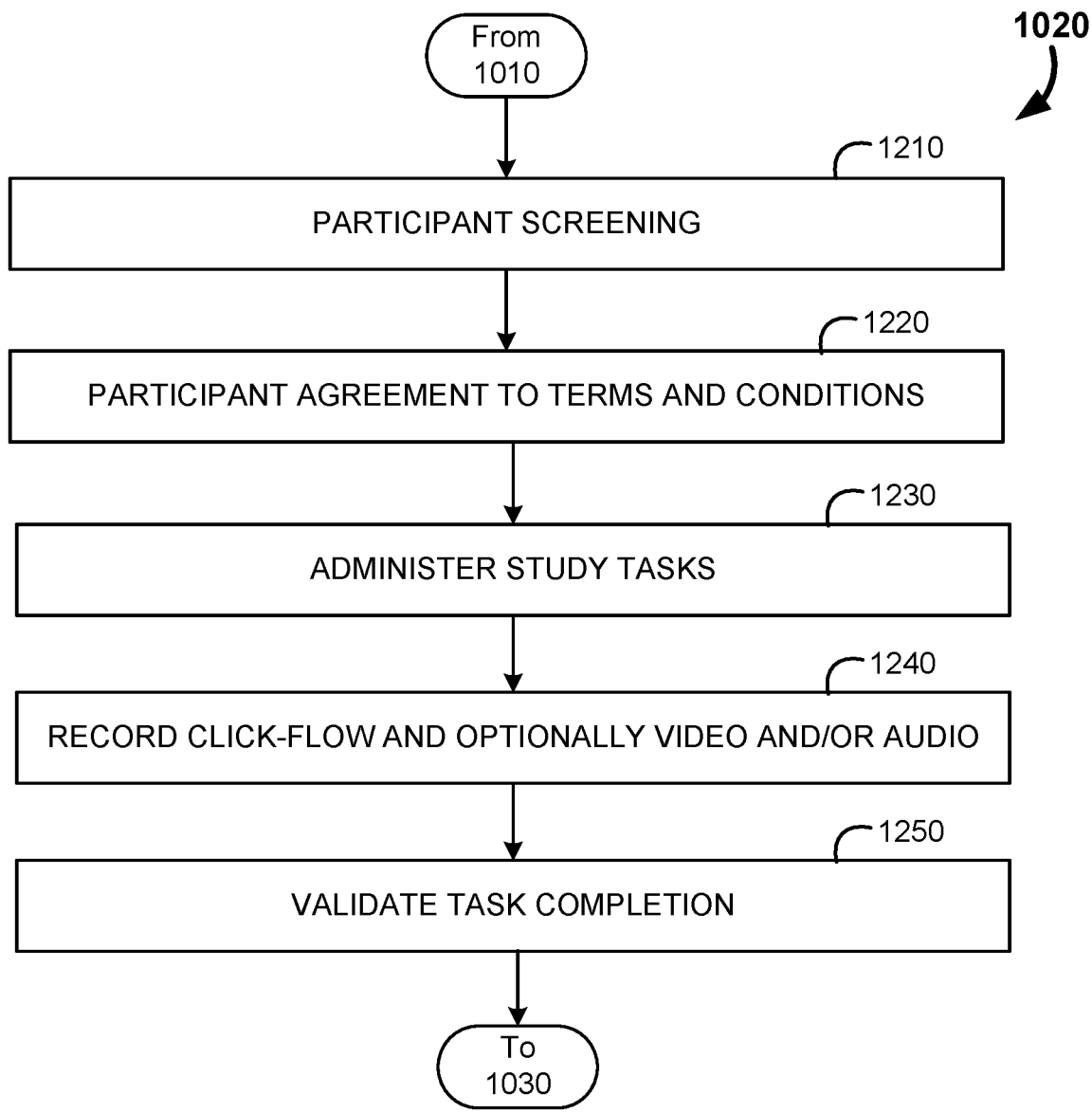
FIG. 12 is a flow diagram for the example process of study administration, in accordance with some embodiment.

After study generation, the study may be implemented, as shown in greater detail at 1020 of FIG. 12. Study implementation begins with screening of the participants (at 1210). This includes initially filtering all possible participants by known demographic or personal information to determine potentially eligible individuals. For example, basic demographic data such as age range, household income and gender may be known for all participants. Additional demographic data such as education level, political affiliation, geography, race, languages spoken, social network connections, etc. may be compiled over time and incorporated into embodiments, when desired. The screener profile may provide basic threshold requirements for these known demographics, allowing the system to immediately remove ineligible participants from the study. The remaining participants may be provided access to the study, or preferentially invited to the study, based upon participant workload, past performance, and study quota numbers. For example, a limited number (less than 30 participants) video recorded study that takes a long time (greater than 20 minutes) may be provided out on an invitation basis to only core panel participants with proven histories of engaging in these kinds of studies. In contrast, a large survey requiring a thousand participants that is expected to only take a few minutes may be offered to all eligible participants.

The initially eligible participants are then presented with the screener questions. This two-phased approach to participant screening ensures that participants are not presented with studies they would never be eligible for based upon their basic demographic data (reducing participant fatigue and frustration), but still enables the user to configure the studies to target a particular participant based upon very specific criteria (e.g., purchasing baby products in the past week for example).

After participants have been screened and are determined to still meet the study requirements, they are asked to accept the study terms and conditions (at 1220). As noted before, privacy regulations play an ever increasing role in online activity, particularly if the individual is being video recorded. Consent to such recordings is necessitated by these regulations, as well as being generally a best practice.

After conditions of the study are accepted, the participant may be presented with the study task (at 1230) which, again, depends directly upon the study type. This may include navigating a menu, finding a specific item, locating a URL, answering survey questions, providing an audio feedback, card sorting, clicking on a static image, or some combination thereof. Depending upon the tasks involved, the clickstream and optionally audio and/or video information may be recorded (at 1240). The task completion is likewise validated (at 1250) if the success criteria is met for the study. This may include task completion in a particular time, locating a specific URL, answering a question, or a combination thereof.

Figure 13:
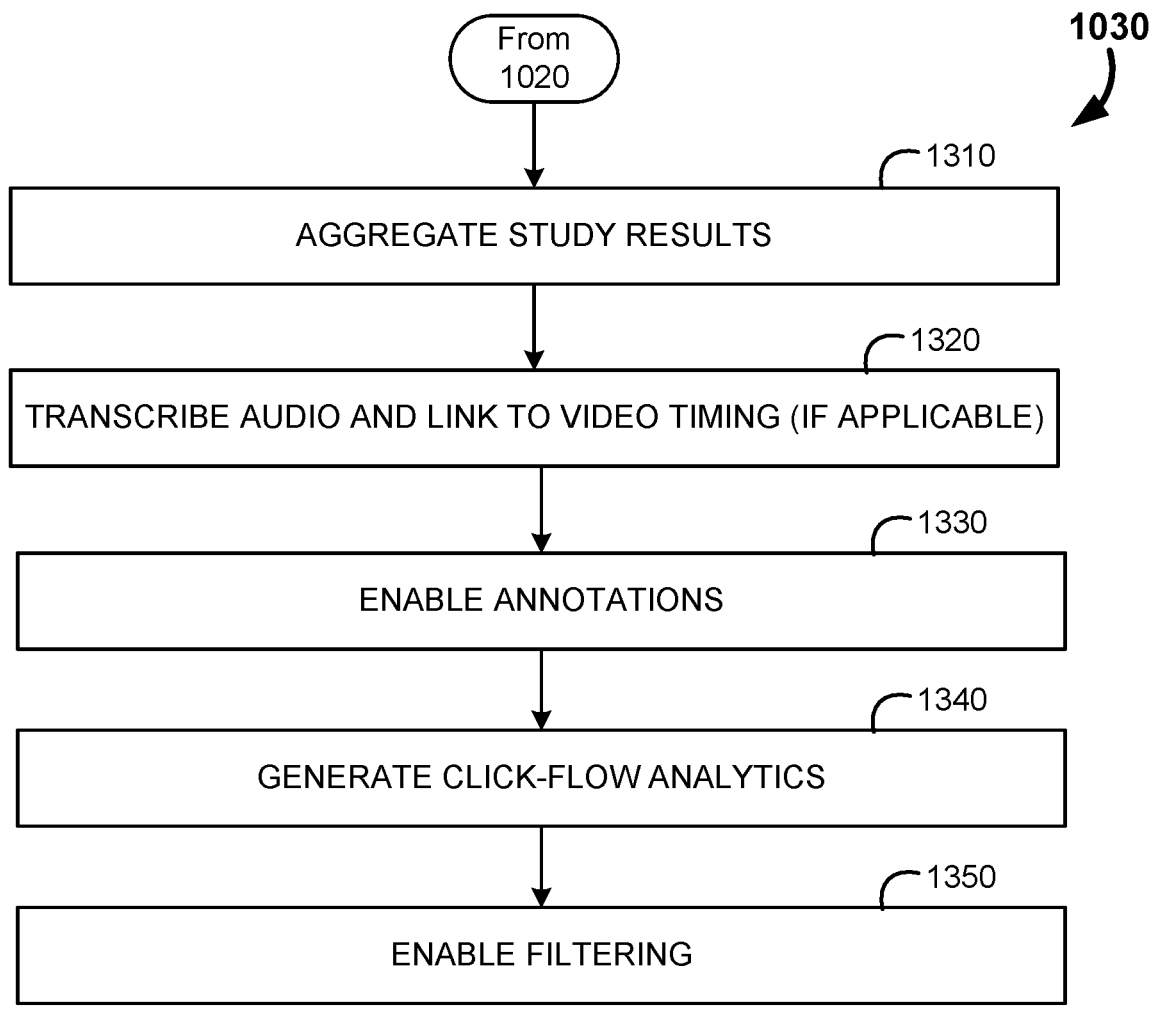
FIG. 13 is a flow diagram for the example process of insight generation, in accordance with some embodiment.

After study administration across the participant quota, insights are generated for the study based upon the results, as seen at 1030 of FIG. 13. Initially the study results are aggregated (at 1310). This includes graphing the number of studies that were successful, unsuccessful and those that were abandoned prior to completion. Confidence intervals may be calculated for these graphs. Similarly, survey question results may be aggregated and graphed. Clickstream data may be aggregated and the likelihood of any particular path may be presented in a branched graphical structure. Aggregation may include the totality of all results, and may be delineated by any dimension of the study.

When an audio or video recording has been collected for the study, these recordings may be transcribed using machine voice to text technology (at 1320). Transcription enables searching of the audio recordings by keywords. The transcriptions may be synchronized to the timing of the recording, thus when a portion of the transcription is searched, the recording will be set to the corresponding frames. This allows for easy review of the recording, and allows for automatic clip generation by selecting portions of the transcription to highlight and tag/annotate (at 1330). The corresponding video or audio clip is automatically edited that corresponds to this tag for easy retrieval. The clip can likewise be shared by a public URL for wider dissemination. Any portion of the results, such as survey results and clickstream graphs, may similarly be annotated for simplified review.

Figure 14:
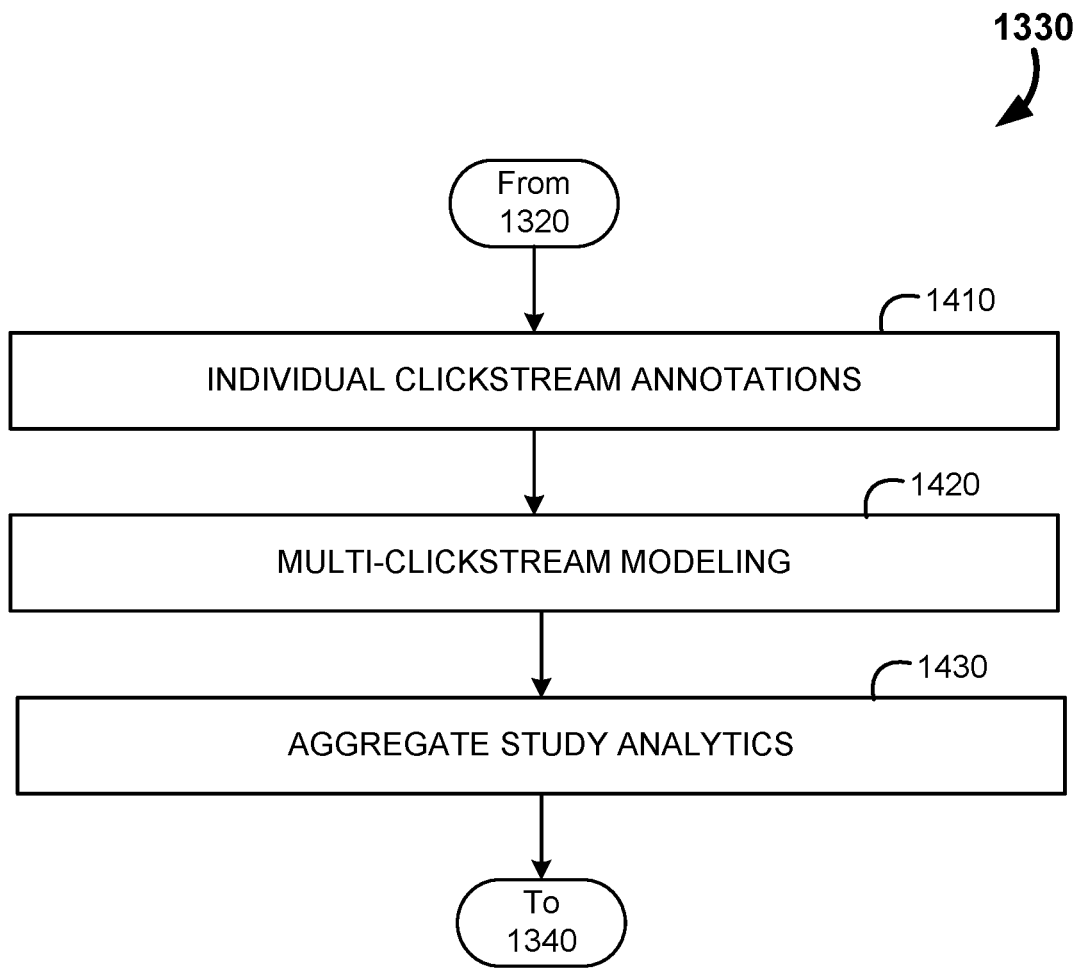
FIG. 14 is a flow diagram for the example process of annotation analysis, in accordance with some embodiment.

The annotation of clickstream data also includes the generation of automated annotations and aggregate analytics, shown in greater detail in FIG. 14. Initially the individual clickstreams are annotated (at 1410), which is used for the training of multi-clickstream modeling (at 1420). The modeling allows for subsequent aggregated study analytics (at 1430).

Figure 15:
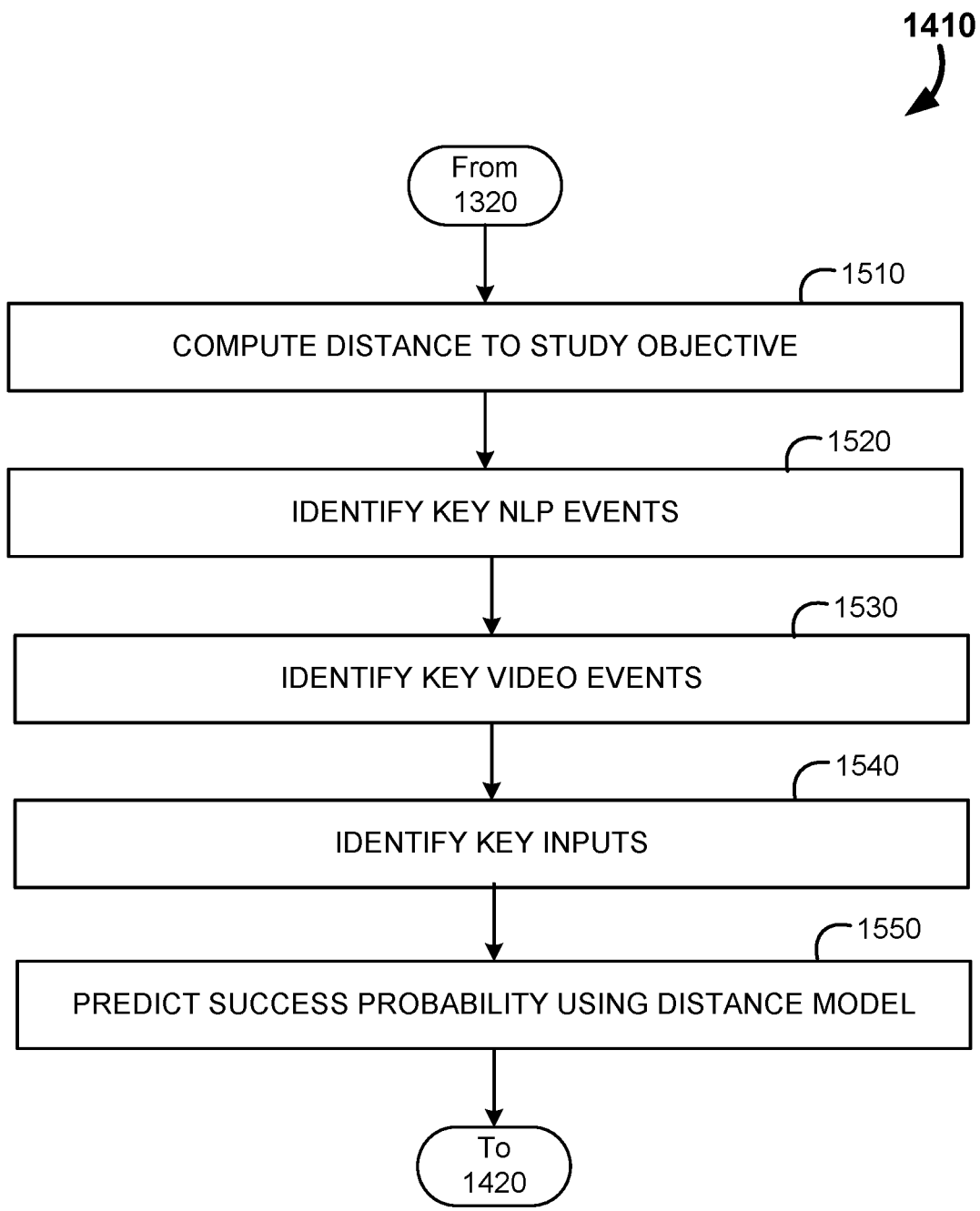
FIG. 15 is a flow diagram for the example process of individual clickstream annotation, in accordance with some embodiment.

Individual clickstream annotation is provided in greater detail in relation to FIG. 15. As discussed previously, the 'distance' from any given state in the target website, or other digital interface, may be modeled to the particular study objective by either raw actions taken by the most efficient path, or by a weighted set of actions (at 1510). Weighting, as previously discussed may be empirically quantified by the time a given action takes, the perceived 'difficulty' of the action (frequency measure) or a combination of the two.

Next, key natural language processing events are identified (at 1520). This includes identifying particular utterances, keywords, or semantic modeling of the transcribed audio component of the study recording. In a similar vein, key video events may likewise be identified (at 1530), again utilizing a suite of AI image recognition tools. Particularly facial recognition AI models exist that classify a user's emotional state exist. Key emotions such as anger, frustration, excitement and contentment may be particularly helpful in determining the user's experience. Any time the model identifies the participant as 'angry' or 'confused' with a confidence of greater than 70% in some embodiments, and 80% in other embodiments, and 90% in some embodiments may identify this time in the video file as a key video event. Other video cues can likewise be flagged as 'key' based upon the desired resulting dataset (for example a company may desire to flag when a participant is reading information in the website as opposed to going off primarily graphical cues, thus eye movement analysis may be employed). Likewise, in some embodiments, a user who exhibits frustration with a task, yet still completes the study task may warrant review despite the successful completion. Results of these advanced machine learning techniques may be automatically annotated into the recording for search by a user during analysis.

In some embodiments, identification of particular key emotions may be performed in near real-time, allowing the system to re-route a participant in the middle of the usability test based upon the detected emotion. For example, if the facial recognition identifies the individual as becoming angry or frustrated, the system could interrupt the usability test and provide the participant a question asking them what aspect of the task is causing the negative emotion, or even providing the participant a different task to complete.

Additionally, key inputs by the participant may likewise be identified (at 1540). This may include the participant selecting the 'back' button (indicating they believe they have made a navigational mistake), returning to a homepage (effectively indicating they are 'starting over'), and the like. All of these key events (NLP, video or inputs) are appended to the record as automatically generated notations.

Lastly, given the distance model that has been previously developed for the target website, or other digital interface, a probability of the participant reaching the study objective may be generated for each stage in the participant's recording. "Good" decisions result in the participant moving 'closer' to the objective (per the distance model) thereby corresponding to a stepwise increase in the probability the participant will achieve the objective. Generally, "bad" navigational decisions decrease the success probability.

Figure 16:
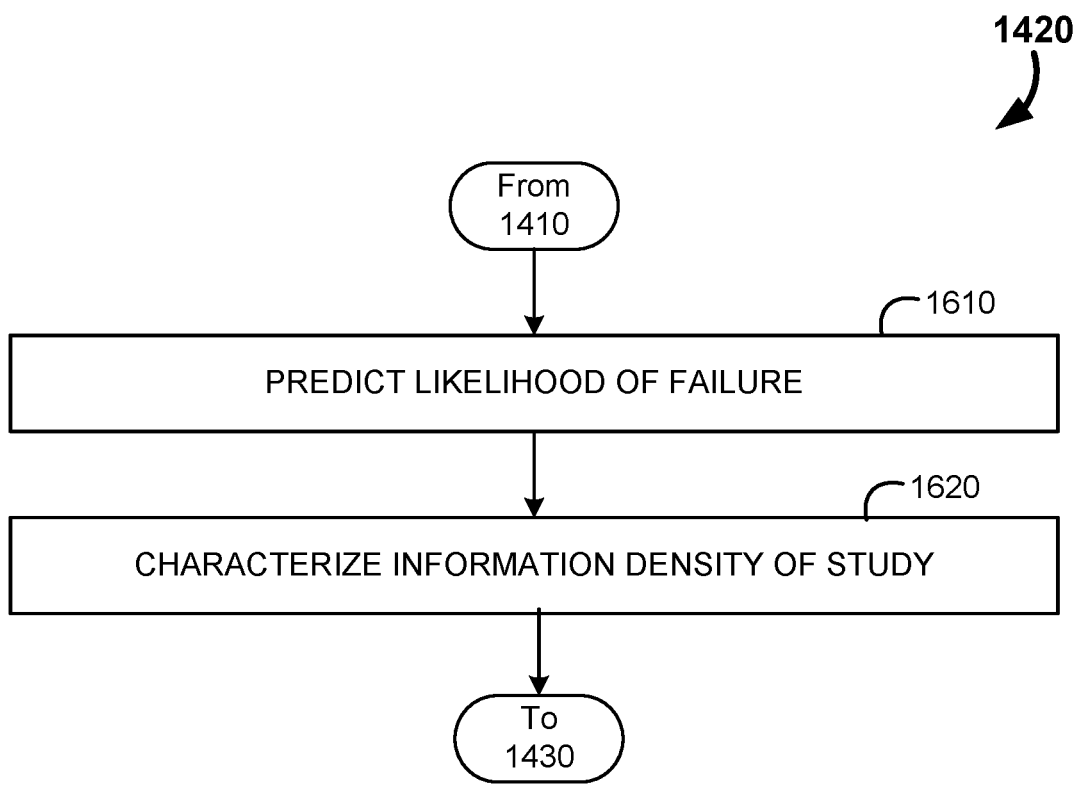
FIG. 16 is a flow diagram for the example process of multiple clickstream modeling, in accordance with some embodiment.

Turning now to FIG. 16, the multi-clickstream modeling is illustrated. The probability of success measures generated for each individual participant may be used to predict the overall likelihood of failure in the objective (at 1610) for the target website given a "generic" user, as well as specific failure predictions given the state a user may find themselves in the target website.

In addition to failure predictions, this multi-clickstream modeling further characterizes information density of the study (at 1620). Information density is the amount of useful information contained in a particular study. For example, if a user in a study navigates easily to the objective on the first try, there is very little information contained in this study because the client will not get any information about where potential confusion points are located. Therefore, this study would have low information density. On the other hand, if a user struggles to achieve the objective, or makes comments during the session that indicate confusion, then this study would likely contain a large amount of actionable information (confusing web page images or text, unclear navigational cues, distracting advertisement placement, as examples) that could be used by the client to improve the website, or other digital interface,. This would be a study with high information density. To enhance the efficiency of the study review process, it is highly desirable to rank studies by decreasing information density so that the most informative studies can be reviewed first.

Figure 17:
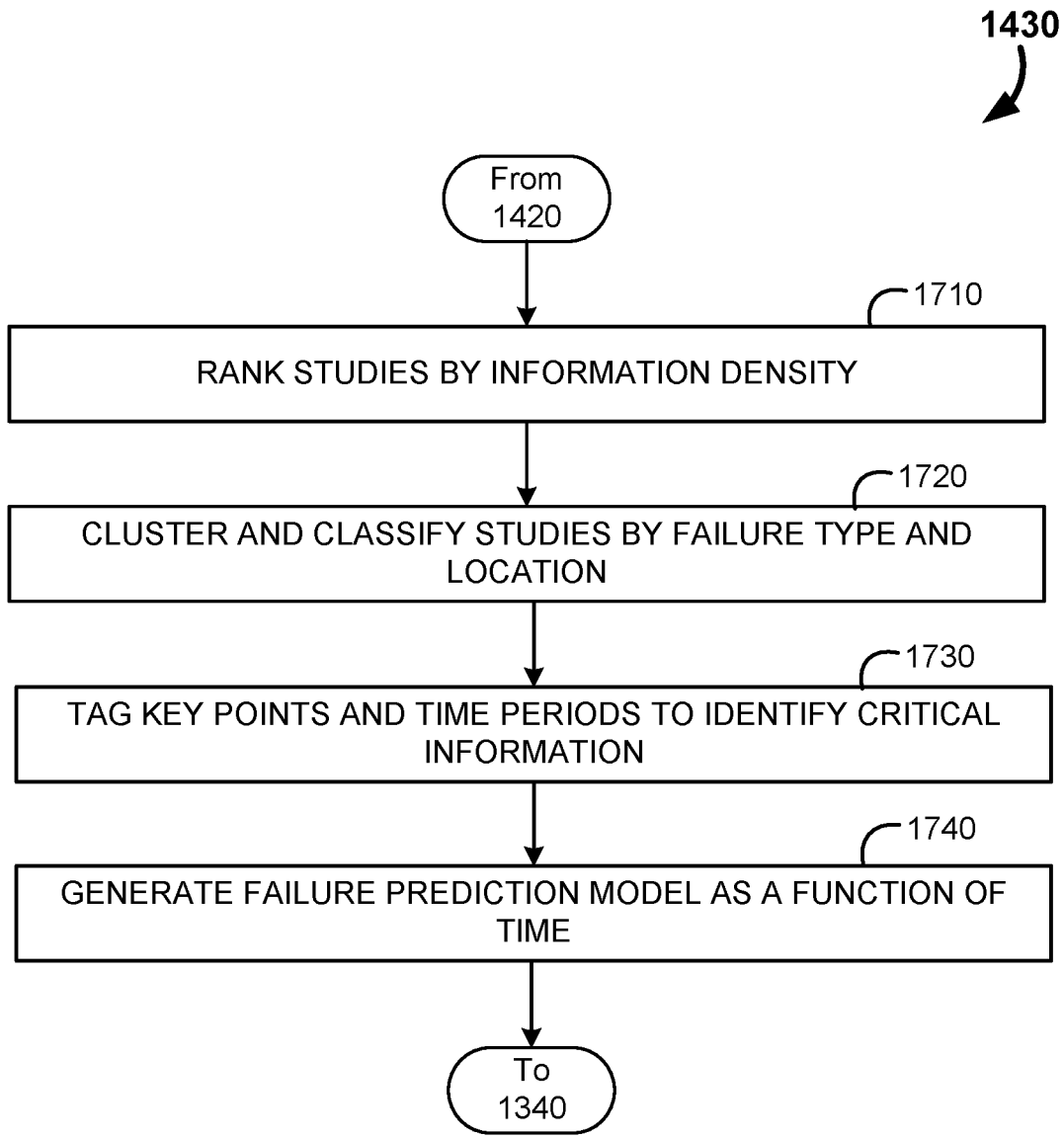
FIG. 17 is a flow diagram for the example process of aggregating study analytics, in accordance with some embodiment.

Turning now to FIG. 17, the process of aggregating the study analytics in provided in greater detail. The disclosed systems and methods enable the application of AI to facilitate the consumption of the insights generated and data collected. Once fully trained, such systems may be able to consume participant studies and subsequently inform stakeholders what they should do in order to improve the digital interface or the digital experience. Such systems automatically generate reports with curated snippets of information from the collected data set (e.g., video clips, a piece of video transcription, charts representing data, an audio stream, etc.) that explains to the stakeholder the 'story' about what problems or opportunities exist in the current digital experience, and what can be done as a recommended solution to improve said experience. Using these AI tools, the stakeholders may even be invited to provide a natural language question, which is analyzed for semantics and syntax to determine the relevant insights that should be provided to the stakeholder.

Initially, studies are ranked by their computed information density (at 1710). The studies are clustered and classified by failure type and location of the failure (at 1720). The key points identified earlier are correlated to time periods in the recordings, and are tagged in order to identify critical information (at 1730) for easier review. In this manner, a human is not required to review countless hours of recorded user experience data, but may rather review only the most critical moments in the process.

The failure predictions for the aggregated studies are then employed to generate a failure prediction model as a function of time (at 1740). Trends on when, or how long a participant takes to achieve a given milestone, can be strong correlators to overall study success or failure rates.

Figure 18:
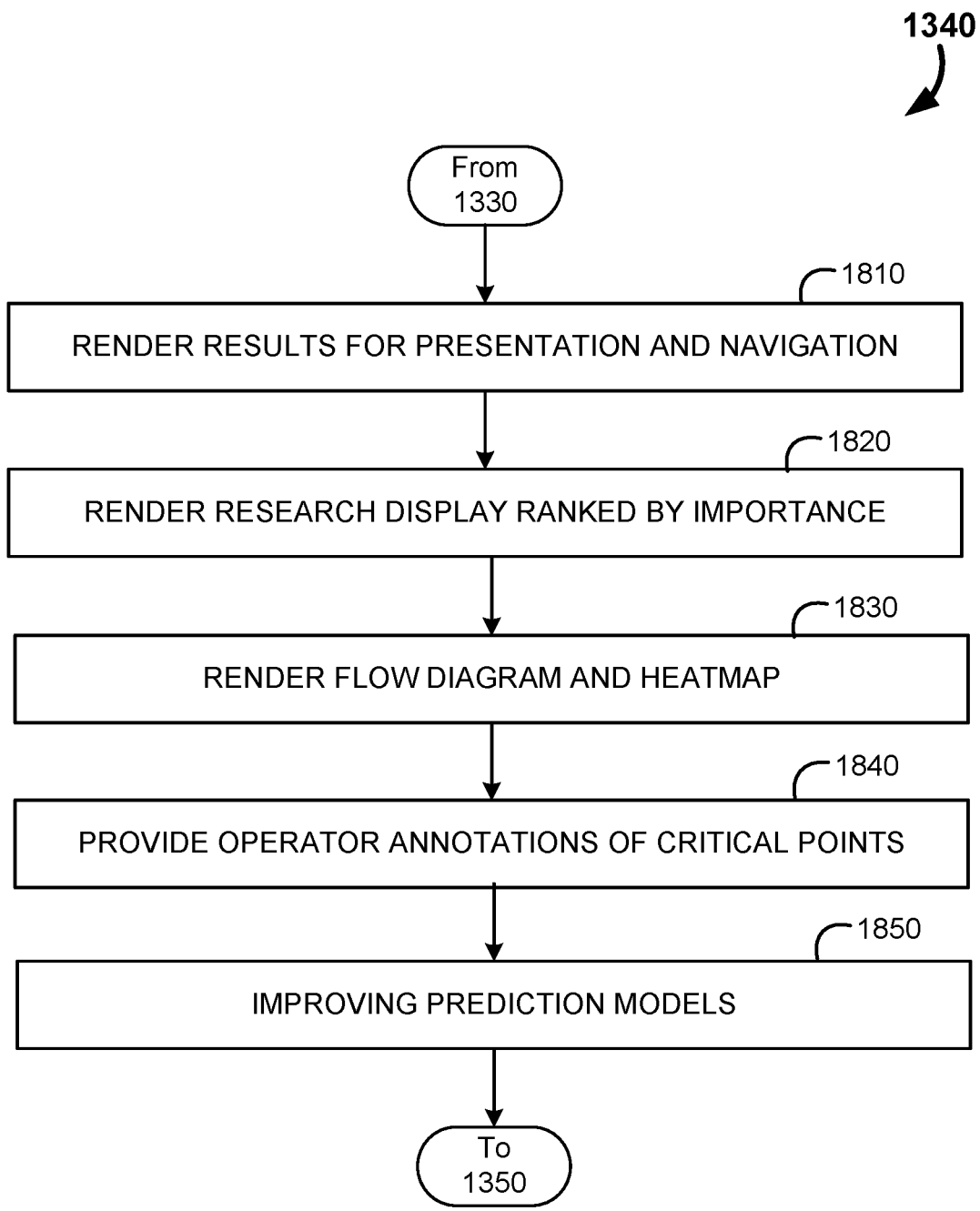
FIG. 18 is a flow diagram for the example process of the generation of click flow analytics, in accordance with some embodiment.

Returning now to FIG. 13, as noted previously, clickstream data is analyzed (at 1340). This may include the rendering of the clickstream graphical interface showing what various participants did at each stage of their task. As noted before, deep learning neural networks may consume these graphs to identify 'points of confusion' which are transition points that are predictive of a failed outcome. FIG. 18 provides a more detailed process diagram for this analysis. Here the results for presentation and navigation are initially rendered (at 1810). Likewise, the research display is ranked by importance and rendered (at 1820). The flow diagram and heat map for the study are further rendered (at 1830).

The operator annotations for any critical points (in addition to automatically identified critical points) are provided in the renderings (at 1840, as applicable. Lastly, this feedback is used to improve the prediction models (at 1850).

Returning now to FIG. 13, all the results are filterable (at 1350) allowing for complex analysis across any study dimension. Here too, machine learning analysis may be employed, with every dimension of the study being a feature, to identify what elements (or combination thereof) are predictive of a particular outcome. This information may be employed to improve the design of subsequent website, or other digital interface, designs, menus, search results, and the like.

Figure 19:
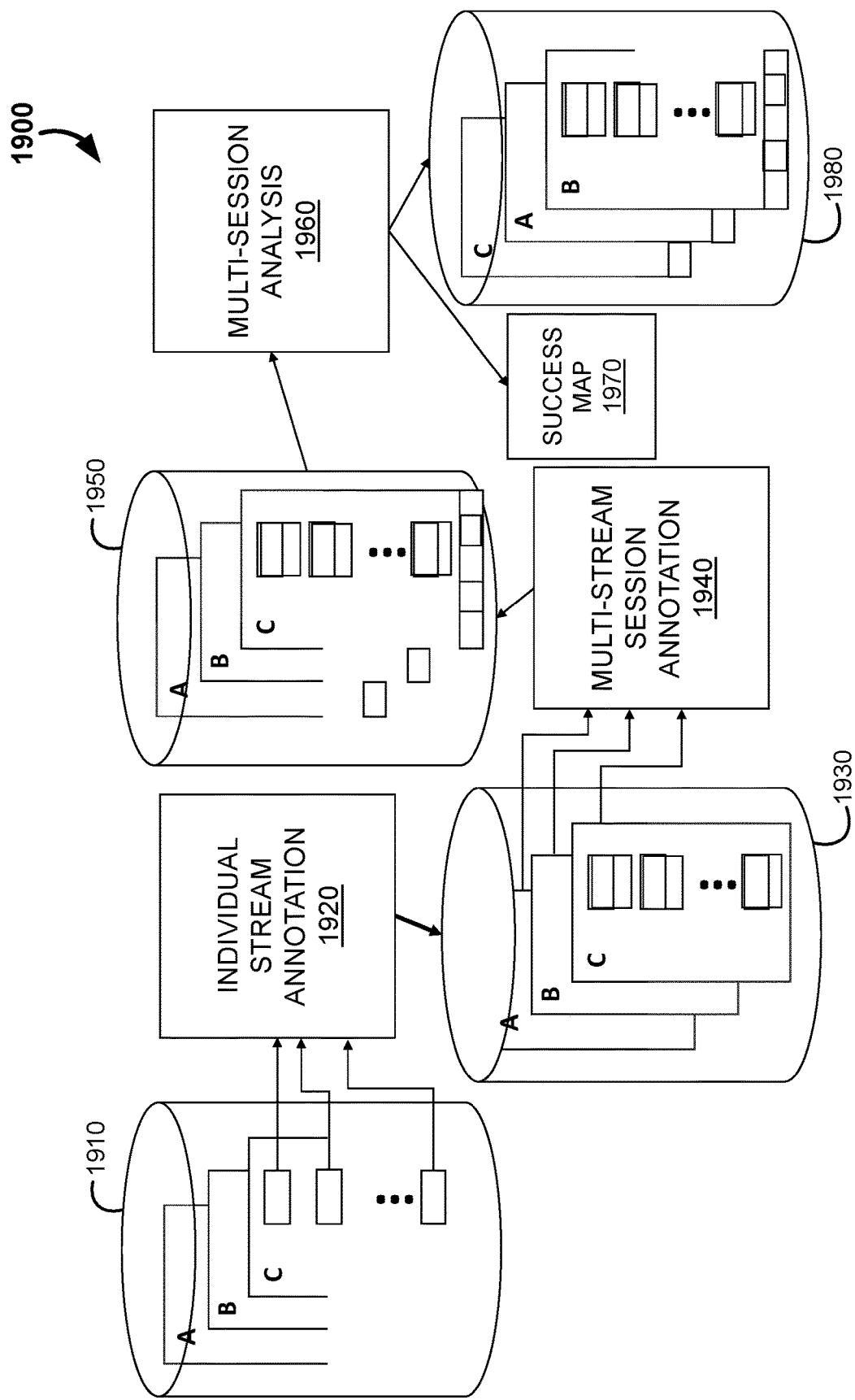
FIG. 19 is an example logical diagram of the AI assisted analysis of user experience data, in accordance with some embodiment.

Turning now to FIG. 19, an example logical diagram 1900 for the annotation and analysis system is provided. The study data 1910 depicts all the data for a specific usability study. In this diagram, sessions are labeled "A", "B", "C" etc. Individual time-ordered and synchronized streams of data are depicted as filled rectangles within each session. Streams include, but are not limited to video and audio of the user, text transcribed from audio, eye tracking data, specific clicks and data entry made by the user ("clickstream"), a logical or video representation of the user's path through the website, annotations, comments and inputs to the system made by the user. Initially, these individual streams are processed by annotation algorithms (as noted above) to generate in individual stream annotation 1920.

Individual streams are annotated (as depicted by unfilled rectangles appended to the bottoms of the filled rectangle streams within each session). There is an unlimited number of algorithmic transformations (e.g., "annotations", "feature extractions", "time-labeled informational tags", "inferences", "signal detection", etc.) that can be applied to each stream as part of the user study analysis process. For example, as previously discussed, with a video stream AI techniques can be used to identify facial expressions and emotions (including highly relevant responses such as frustration, anger, confusion, joy, etc.) along with patterns of behavior that are associated with success or failure of specific tasks. Such signals can include inferences from the timing of different features: a longer or shorter time between attention and expression changes can impact the inference derived from the video (proportional or exponential weighting of time of expression change/attention shift to the classified inference). Eye tracking, when available, can indicate where the user's gaze is focused and changes in gaze pattern are indicative of important moments in the session.

Similarly, audio can be processed using AI methods to detect changes in psychological state (e.g., tension in the voice, changes in vocalization and amplitude patterns, confidence, confusion, etc.). Text can be processed to identify key events during the session in a variety of ways, including but not limited to identification of key terms (e.g., exclamations, strong language, negative or positive terms, etc.) and recognition of linguistic patterns that indicate mental state, confusion, etc. Sentiment analysis may also be performed on the audio and video recording data, which may be leveraged to directly identify key events during the recordings, or to detect the 'average' mood of the participant such that researchers may later segment the participants into groups such as "happy" participants, "frustrated" participants, etc. Text analysis may also include keyword analysis for detecting when the participant mentions key terms, such as the brand name of the site the user study is performed on (or conversely a competitor's name). The sentiment analyzed at the time of the utterance (either from the audio and video analysis, or via text semantic analysis) may be appended to the utterance of the brand name.

A critical stream annotation that is derived from the distance model is the ongoing "distance" of the user from the desired study objective. Patterns in the distance (or predicted success/failure rate) are critical to the identification of confusion points and other important moments in the user study process.

In some embodiments, multiple streams are annotated simultaneously for some purposes, for example using a multitask deep learning algorithm. As an example, the combination of a "frustrated" facial expression, combined with a "negative" verbal exclamation in the text stream, may provide a very important annotation for downstream analysis.

The complete data set for a user study, including all annotations added by individual stream annotation 1920, synchronized across all of the streams, results in a dataset 1930. This dataset 1930 is then processed by a multi-stream session annotation 1940. In this phase, raw data and annotated data from all streams from each session are analyzed further to generate session-level annotations. Session-level annotations define potential confusion points, identify sections of video and clickstream data that contain important information for further analysis and define overall metrics for each session such as, for example, success/failure, user error or failure type, number of points with high predicted failure likelihood, time to complete task, time characteristics of subtasks, etc. These Session-level annotations and statistics are used downstream to rank and organize sessions to facilitate further visualization and analysis.

In this phase, sessions containing spurious data, outliers or other anomalies (for example, a user answers a phone call mid-session or becomes distracted following an online advertisement) can be identified for further filtering, as appropriate. The resulting dataset 1950 includes the set of data for a User Study that includes annotated Session data, raw stream data and annotated stream data. This dataset 1950 is used for multi-session analysis 1960.

In this phase, all sessions in a user study can be analyzed in the aggregate, generating statistical distributions of session-level data, further identifying anomalous sessions for filtering purposes, ranking sessions by a variety of criteria and developing a success map of the website that reports on key user study attributes of each web page in the target website, or other digital interface 110, among other possible applications.

Outputs of this phase, include a success map 1970 and study data 1980 which is annotated and ranked. The success map 1970 presents the value of a specific performance metric for each web page in the target website, or other digital interface, 110. A performance metric can be any measure that indicates where confusion points and other key outcomes of usability testing are located. Some examples of performance metrics that can be presented in a success map include the predicted likelihood of failure, probability of taking a valuable or erroneous next step in the website navigation, or frequency that current web page is a confusion point. The success map summarizes the entire user study to quickly identify the target website locations that require changes to increase usability.

The dataset 1980 represents all of the user study data including session-level annotations and ranking (based on a variety of criteria as determined by the testing operator), raw stream data and annotated stream data, all of which have been prepared to facilitate downstream analysis, visualization, filtering, rendering and any other process required to generate valuable insights. Two very important applications of this annotated data set are session ranking and AI-assisted stream navigation. Session ranking allows rapid identification of sessions that are most prototypical, indicative or informative for a specific failure or error type, so that conclusions may be drawn quickly. AI-assisted stream navigation provides user interface controls that allow the client to "fast forward" past parts of a session that are not informative and to quickly navigate to portions of the session streams that are most indicative of needed website redesign or improvements.

Links between the different outputs of the multi session analysis 1960 can be used to navigate between views. For example, it is possible to "click on" or select a particular location in the success map 1970 to then be presented with a ranked list of sessions that contain the most informative examples of this failure type at this point. In this phase of analysis, machine learning/AI in the form of prescriptive analytics can be used to recommend what changes should be made to the website, or other digital interface, to reduce the likelihood of the errors and failures that were recorded in the user study. AI algorithms are increasingly able to identify what information is most relevant to a specific inference or result. For example, in computer vision applications in which an image is being classified (e.g. "is it a cat or a fox in this picture?") there are several techniques that can be used to highlight the portions of the image that most impact the classification decision. Extending this idea to algorithms that predict the likelihood of success or failure at each point in the target website 110, it is possible to highlight which parts of the web page are impacting the success prediction. If image data from the website are being used, then the analogy could be exact. When other information is being used to predict the probability of success, then it is still possible to highlight the most important component in the prediction and therefore identify exactly what in the web page needs to change. In fact, it is also possible to automate the creation of experiments (for example A/B testing) based on these algorithm components, run such experiments and then improve the website automatically by adopting the preferred result from the experiment. Additional methods to automatically suggest digital interface improvements can be imagined using modern AI methods.

One powerful aspect of the present systems and methods is that generated insights may be collated and shared with various stakeholders in an automated manner. This lends the system to a collaborative architecture where different stakeholders can cooperate to ask for insights and also consume relevant insight that may impact their business area in the interest of generation better experiences.

While the above discussion has been focused upon testing the user experience in a website for data generation, it is also possible that these systems and methods are proactively deployed defensively against competitors who are themselves engaging in user experience analysis. This includes first identifying when a user experience test is being performed, and taking some reaction accordingly. Red-flag behaviors, such as redirection to the client's webpage from a competitive user experience analytics firm is one clear behavior. Others could include a pattern of unusual activity, such as a sudden increase in a very discrete activity for a short duration.

Once it is determined that a client's website has been targeted for some sort of user experience test, the event is logged. At a minimum this sort of information if helpful to the client in planning their own user experience tests, and understanding what their competitors are doing. However, in more extreme situations, alternate web portals may be employed to obfuscate the analysis being performed.

Some portions of the above detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is, here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

The algorithms and displays presented herein are not inherently related to any particular computer or other apparatus. Various general-purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may, thus, be implemented using a variety of programming languages.

In alternative embodiments, the machine operates as a standalone device or may be connected (e.g., networked) to other machines. In a networked deployment, the machine may operate in the capacity of a server or a client machine in a client-server network environment or as a peer machine in a peer-to-peer (or distributed) network environment.

The machine may be a server computer, a client computer, a virtual machine, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies of the presently disclosed technique and innovation.

In general, the routines executed to implement the embodiments of the disclosure may be implemented as part of an operating system or a specific application, component, program, object, module or sequence of instructions referred to as "computer programs." The computer programs typically comprise one or more instructions set at various times in various memory and storage devices in a computer, and when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution While this invention has been described in terms of several embodiments, there are alterations, modifications, permutations, and substitute equivalents, which fall within the scope of this invention. Although sub-section titles have been provided to aid in the description of the invention, these titles are merely illustrative and are not intended to limit the scope of the present invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A method for artificial intelligence (AI) assisted analysis of a user experience study comprising:
training an AI model to detect incidents of interest, wherein the incidents of interest include user abandonment, user failure, user frustration, and delayed completion of an objective using a first training set; identifying the incidents of interest within a second training set;
training the AI model to detect at least one trigger for the identified incidents of interest using the second training set;
receiving at least one study for analysis; identifying the incidents of interest within the at least one study;
receiving a query for a specific incident of interest within the study;
selecting the trigger for the specific incident of interest using the AI model; and generating at least one analytics output including the selected trigger;
wherein the analytics output includes at least one of a heat map, a clickstream, a sentiment analysis, an audio clip, a video clip, a question chart with confidence intervals, and a word cloud.

2. The method of claim 1, wherein the query is a natural language question.

3. The method of claim 1, wherein the second training set includes feedback from a human if the insights provided are helpful and relevant.

4. The method of claim 1, wherein the first raining set includes study results here a human annotates incidents of interest.

5. The method of claim 1, further comprising getting feedback on the generated analytics output.

6. The method of claim 5, further comprising generating additional analytics output responsive to the feedback.

7. The method of claim 1, wherein the analytics output includes at least one of a heat map, a clickstream, a sentiment analysis, an audio clip, a video clip, a transcript, a data point or key performance indicator (KPI), screenshot, a data table with counts, percentages, averages, medians and standard deviations, question chart with or without confidence intervals, an open ended answer, keywords, a dendrogram, a treemap, cross tabulation or comparison data table, dashboard, emotions chart and a word cloud.

* * * * *